United States Patent
Kato et al.

(10) Patent No.: US 10,727,262 B2
(45) Date of Patent: Jul. 28, 2020

(54) PHOTOELECTRIC CONVERSION ELEMENT, IMAGING DEVICE, AND ELECTRONIC APPARATUS COMPRISING A PHOTOELECTRIC CONVERSION LAYER HAVING AT LEAST A SUBPHTHALOCYANINE OR A SUBPHTHALOCYANINE DERIVATIVE AND A CARRIER DOPANT

(71) Applicant: SONY CORPORATION, Tokyo (JP)

(72) Inventors: Yu Kato, Kanagawa (JP); Ichiro Takemura, Kanagawa (JP); Yoshiaki Obana, Kanagawa (JP); Nobuyuki Matsuzawa, Tokyo (JP)

(73) Assignee: SONY CORPORATION, Tokyo (JP)

( * ) Notice: Subject to any disclaimer, the term of this patent is extended or adjusted under 35 U.S.C. 154(b) by 68 days.

(21) Appl. No.: 16/064,717

(22) PCT Filed: Dec. 27, 2016

(86) PCT No.: PCT/JP2016/088926
§ 371 (c)(1),
(2) Date: Jun. 21, 2018

(87) PCT Pub. No.: WO2017/122538
PCT Pub. Date: Jul. 20, 2017

(65) Prior Publication Data
US 2019/0013342 A1    Jan. 10, 2019

(30) Foreign Application Priority Data

Jan. 13, 2016 (JP) .................................. 2016-004383
Mar. 25, 2016 (JP) .................................. 2016-062422

(51) Int. Cl.
*H01L 27/146* (2006.01)
*H01L 31/10* (2006.01)
(Continued)

(52) U.S. Cl.
CPC ...... *H01L 27/14621* (2013.01); *H01L 27/146* (2013.01); *H01L 27/14612* (2013.01);
(Continued)

(58) Field of Classification Search
CPC ............. H01L 27/146; H01L 27/14621; H01L 27/307; H01L 51/0078; H01L 27/14665;
(Continued)

(56) References Cited

U.S. PATENT DOCUMENTS 8,105,431 B2 * 1/2012 Mori ..................... C09B 47/045
106/287.2
9,130,175 B2 * 9/2015 Lee ....................... H01L 51/0072
(Continued)

FOREIGN PATENT DOCUMENTS

CA    2476168 A1    2/2005
CN    1591926 A     3/2005
(Continued)

OTHER PUBLICATIONS

Li, et al., "Leuco Crystal Violet as a Dopant for n-Doping of Organic Thin Films of Fullerene C60", The Journal of Physical Chemistry B, vol. 108, Issue 44, Oct. 8, 2004, pp. 17076-17082.
(Continued)

*Primary Examiner* — Que Tan Le
(74) *Attorney, Agent, or Firm* — Chip Law Group

(57) ABSTRACT

A photoelectric conversion element according to an embodiment of the disclosure includes a first electrode and a second electrode that are disposed to face each other and a photoelectric conversion layer that is provided between the first electrode and the second electrode, and contains at least a subphthalocyanine or a subphthalocyanine derivative, and a carrier dopant, in which the carrier dopant has a concentration of less than 1% by volume ratio to the subphthalocyanine or the subphthalocyanine derivative.

16 Claims, 15 Drawing Sheets

(51) Int. Cl.
| | | |
|---|---|---|
| *H01L 27/30* | (2006.01) | |
| *H01L 51/00* | (2006.01) | |
| *H01L 51/42* | (2006.01) | |
| *H01L 51/52* | (2006.01) | |
| *H04N 5/335* | (2011.01) | |

(52) U.S. Cl.
CPC .. *H01L 27/14638* (2013.01); *H01L 27/14647* (2013.01); *H01L 27/14665* (2013.01); *H01L 27/307* (2013.01); *H01L 31/10* (2013.01); *H01L 51/002* (2013.01); *H01L 51/0078* (2013.01); *H01L 51/42* (2013.01); *H01L 51/5262* (2013.01); *H04N 5/335* (2013.01); *H01L 27/1464* (2013.01); *H01L 51/4253* (2013.01); *Y02E 10/549* (2013.01)

(58) Field of Classification Search
CPC . H01L 51/42; H01L 51/442; H01L 27/14638; H01L 27/14647; H01L 27/30; H01L 51/4273; H01L 51/441; H04N 5/335; H04N 5/372
USPC ..................................................... 250/208.1
See application file for complete search history.

(56) References Cited

U.S. PATENT DOCUMENTS

| | | | |
|---|---|---|---|
| 9,680,104 B2 * | 6/2017 | Udaka | .................. H01L 27/307 |
| 2005/0061232 A1 | 3/2005 | Werner et al. | |
| 2009/0039770 A1 | 2/2009 | Kang et al. | |
| 2011/0240980 A1 | 10/2011 | Wei et al. | |
| 2015/0287946 A1 | 10/2015 | Leem et al. | |

FOREIGN PATENT DOCUMENTS

| | | | |
|---|---|---|---|
| CN | 101223827 | A | 7/2008 |
| CN | 104979476 | A | 10/2015 |
| DE | 10338406 | A | 3/2005 |
| EP | 1508903 | A2 | 2/2005 |
| EP | 1913798 | A1 | 4/2008 |
| EP | 2927981 | A1 | 10/2015 |
| JP | 2002-190616 | A | 7/2002 |
| JP | 2005-063960 | A | 3/2005 |
| JP | 2009-500861 | A | 1/2009 |
| JP | 2015-201619 | A | 11/2015 |
| JP | 2015-233117 | A | 12/2015 |
| KR | 10-2005-0020663 | A | 3/2005 |
| KR | 10-2007-0009456 | A | 1/2007 |
| KR | 10-2013-0023237 | A | 3/2013 |
| KR | 10-2015-0115477 | A | 10/2015 |
| TW | 200509428 | A | 3/2005 |
| TW | 200733808 | A1 | 9/2007 |
| WO | 2002/050920 | A1 | 6/2002 |
| WO | 2007/011132 | A1 | 1/2007 |
| WO | 2011/127075 | A1 | 10/2011 |
| WO | 2015/174010 | A1 | 11/2015 |

OTHER PUBLICATIONS

Naab, et al., "Mechanistic Study on the Solution-Phase n-Doping of 1,3-Dimethyl-2,3-dihydro-1H-benzoimidazole Derivatives", Journal of American Chemical Society, vol. 135, Sep. 6, 2013, pp. 15018-15025.

International Search Report and Written Opinion of PCT Application No. PCT/JP2016/088926, dated Apr. 4, 2017, 09 pages of ISRWO.

* cited by examiner

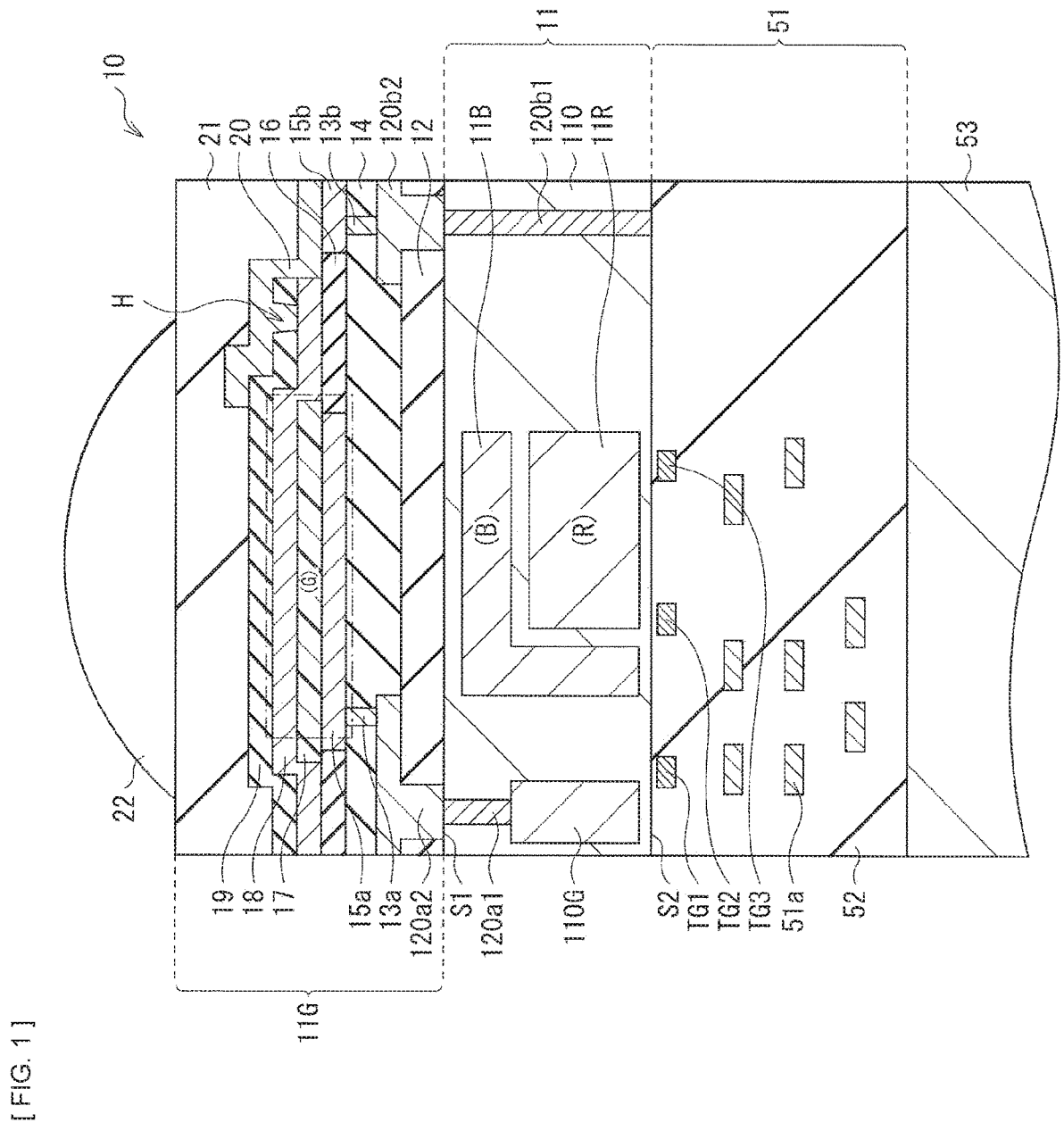

[FIG. 2]
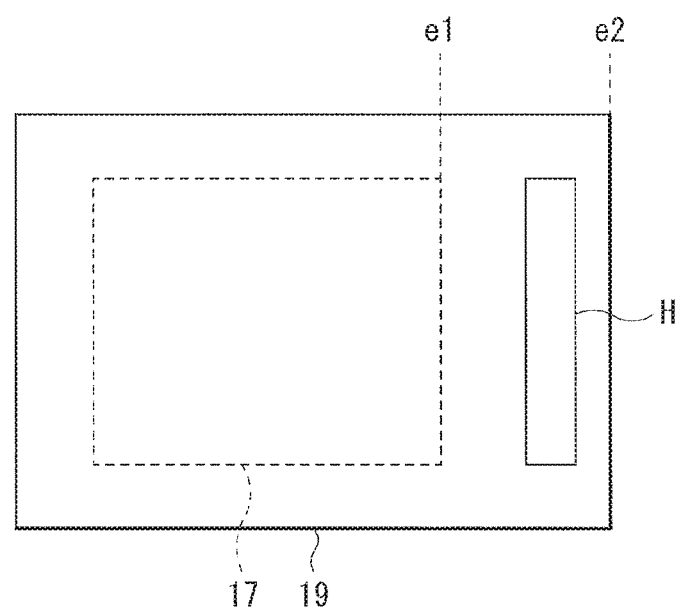

[FIG. 3A]
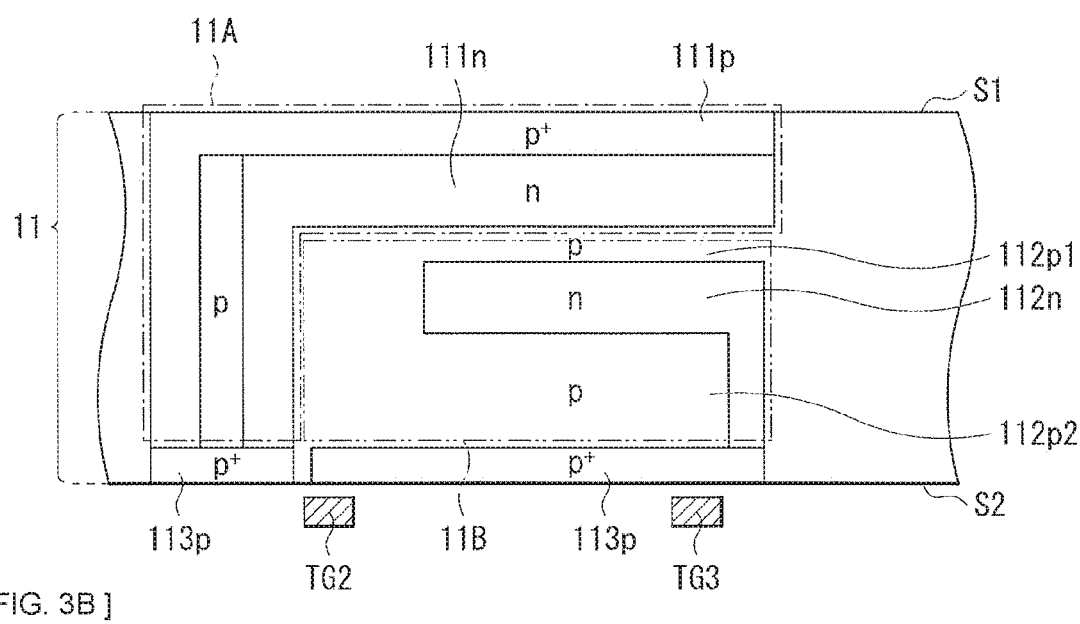
[FIG. 3B]
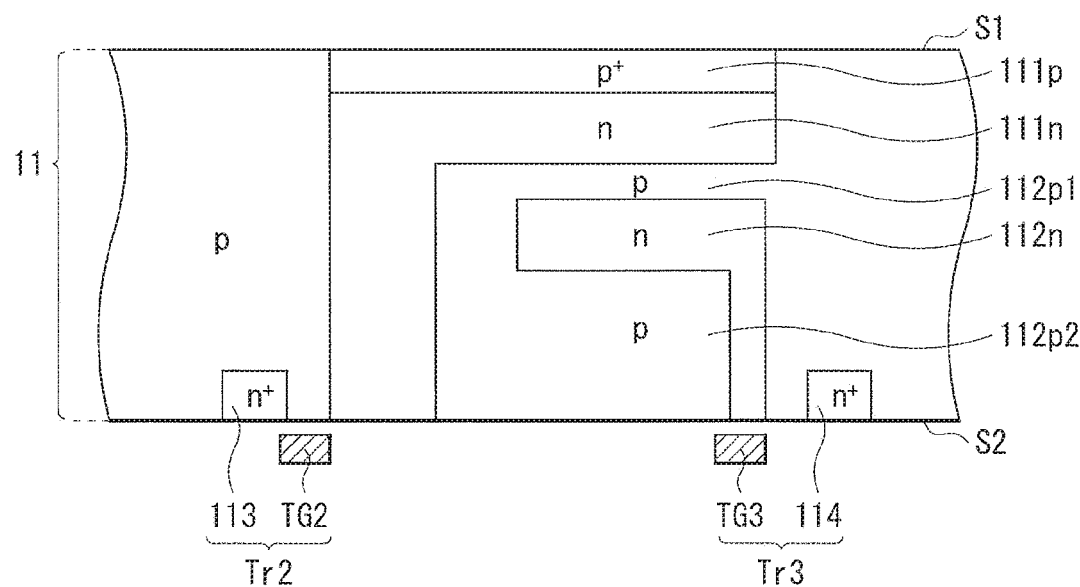

[FIG. 4]
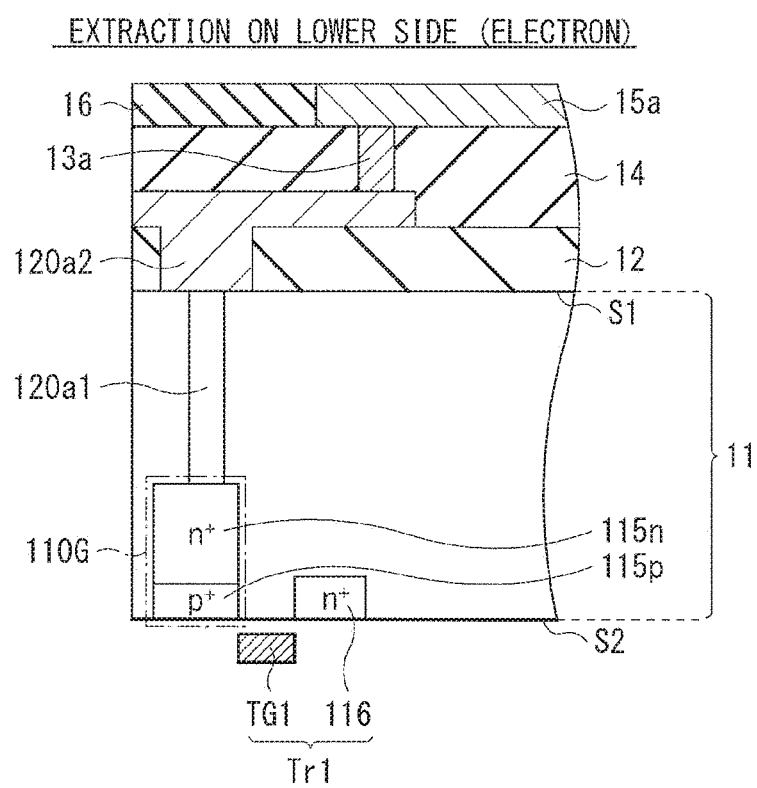

[FIG. 5A]
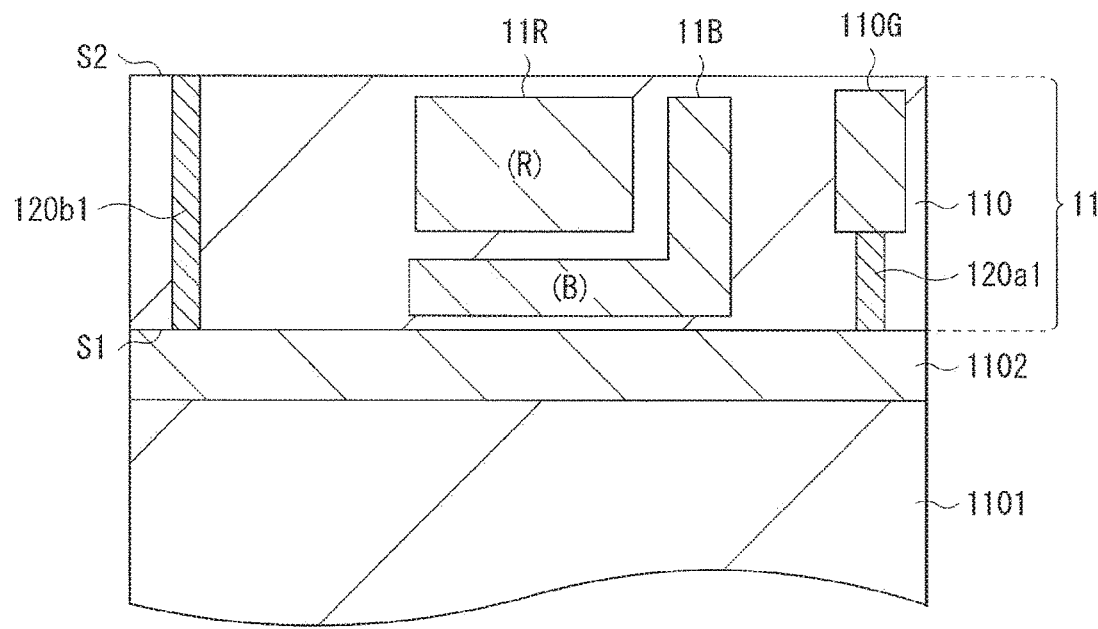
[FIG. 5B]
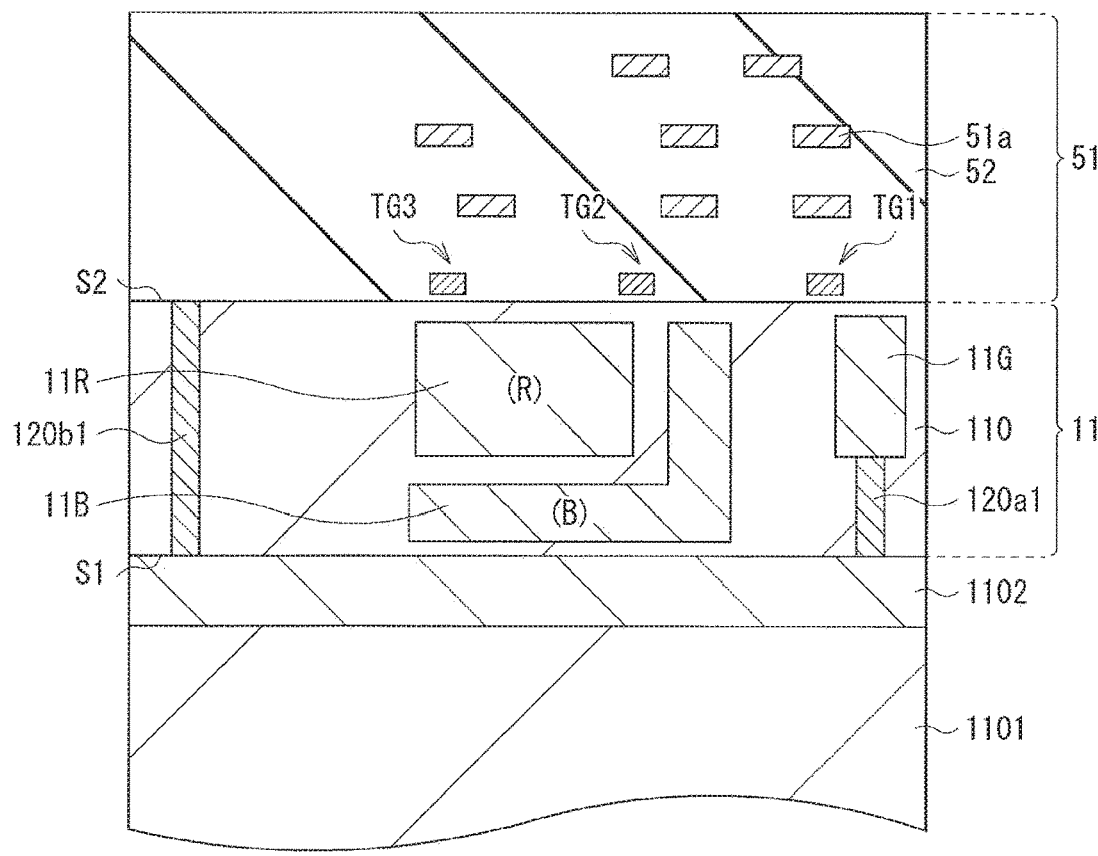

[FIG. 6A]
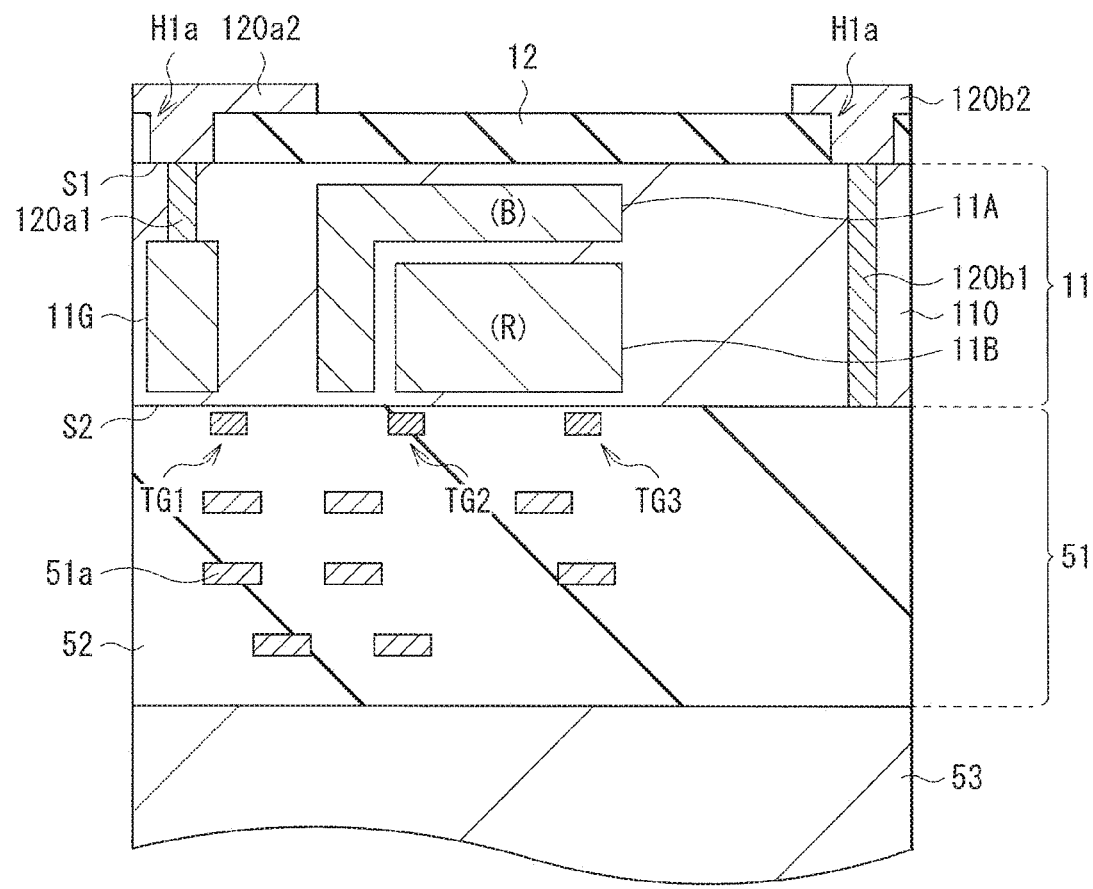

[FIG. 6B]
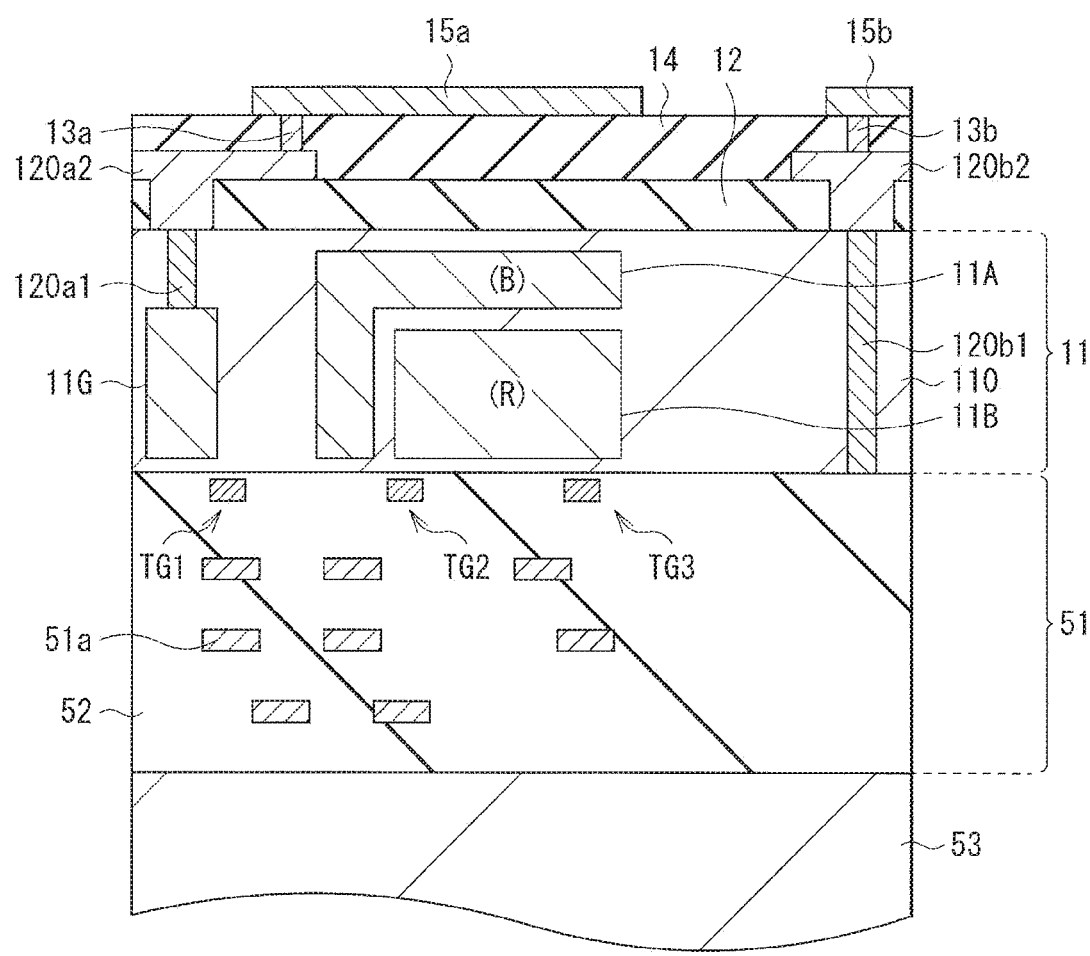

[FIG. 7A]
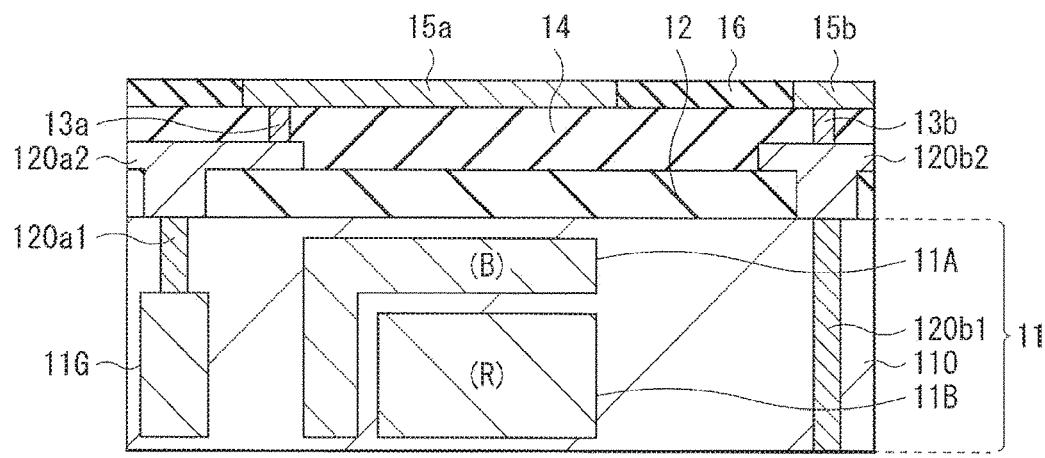
[FIG. 7B]
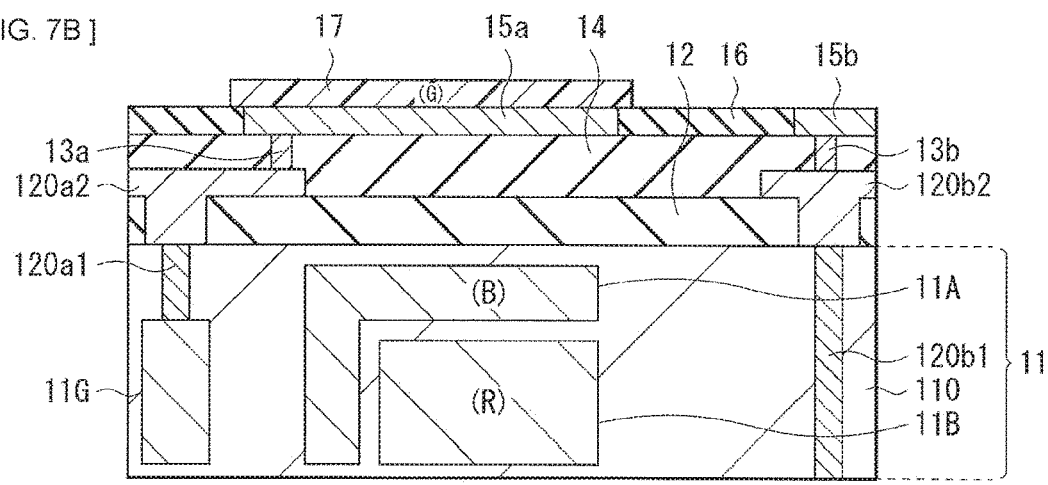
[FIG. 7C]
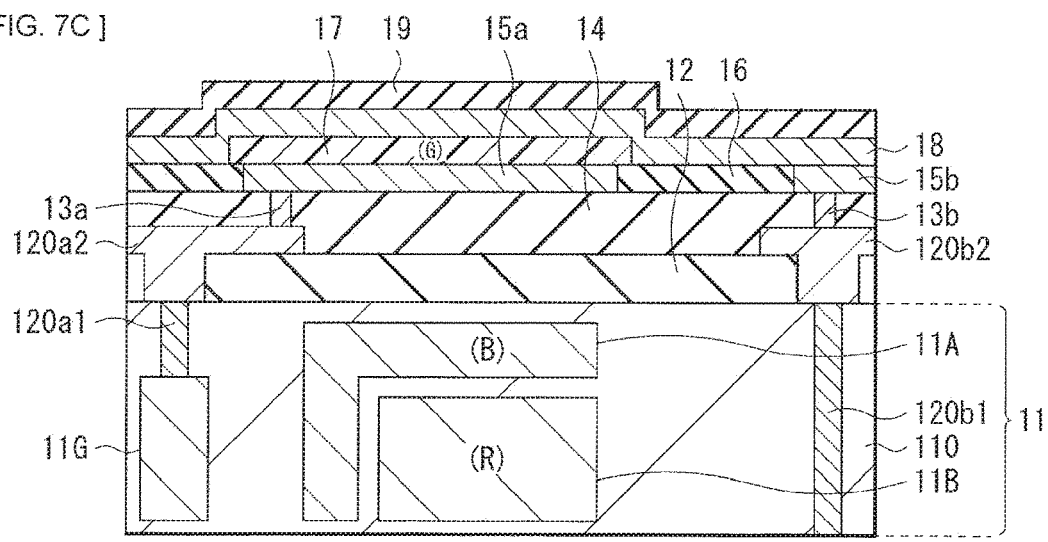

[FIG. 8]
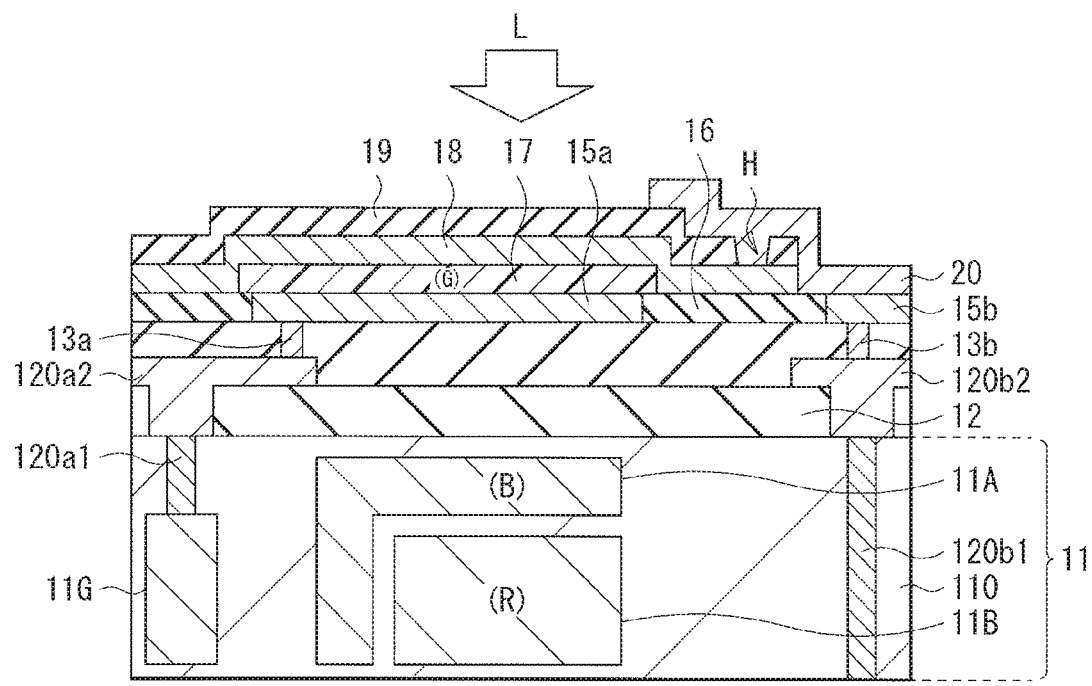
[FIG. 9]
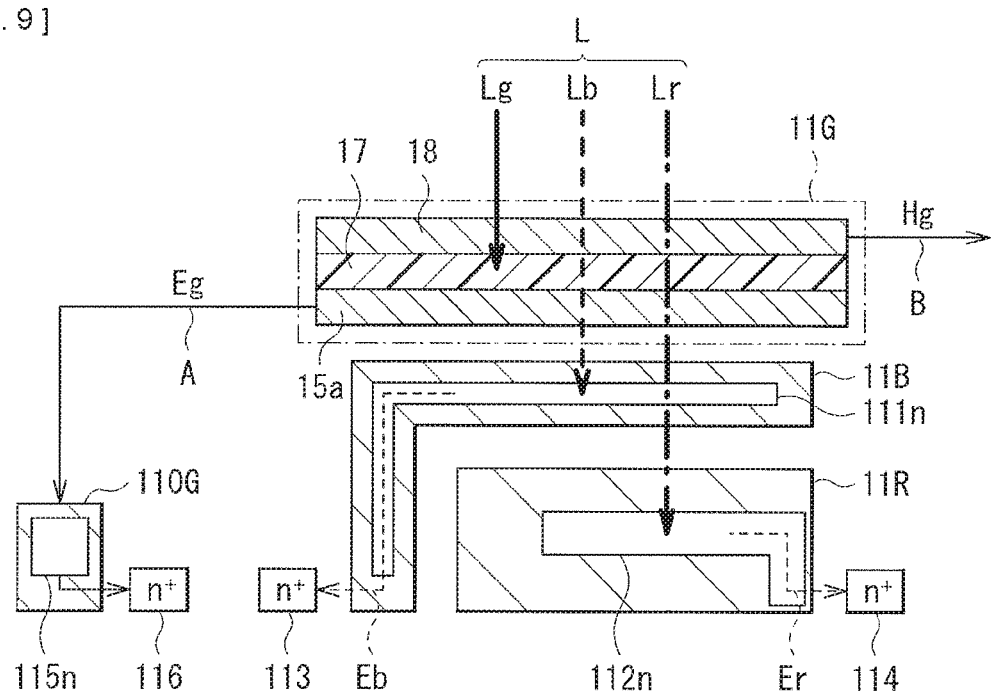

[ FIG. 10 ]
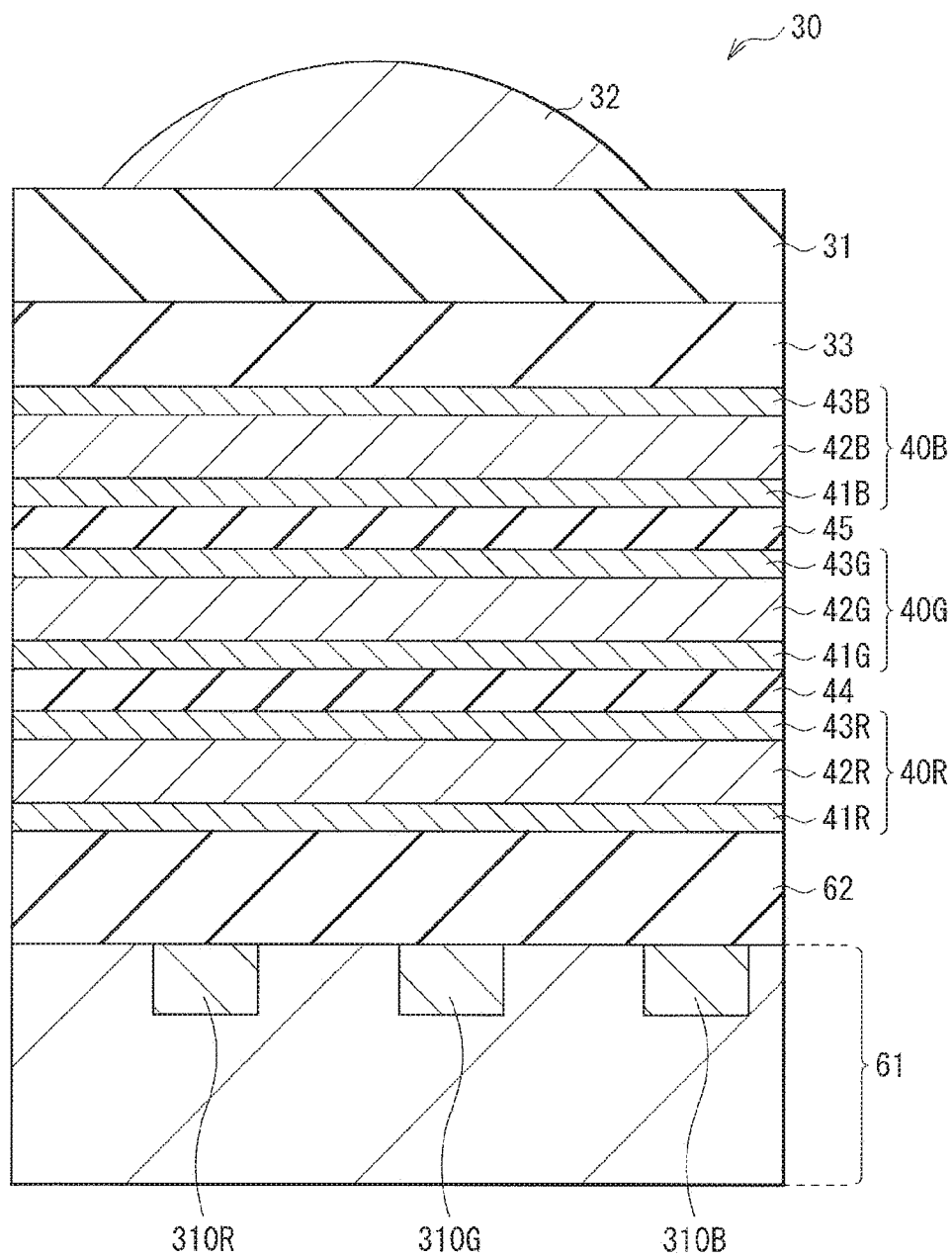

[FIG. 11]
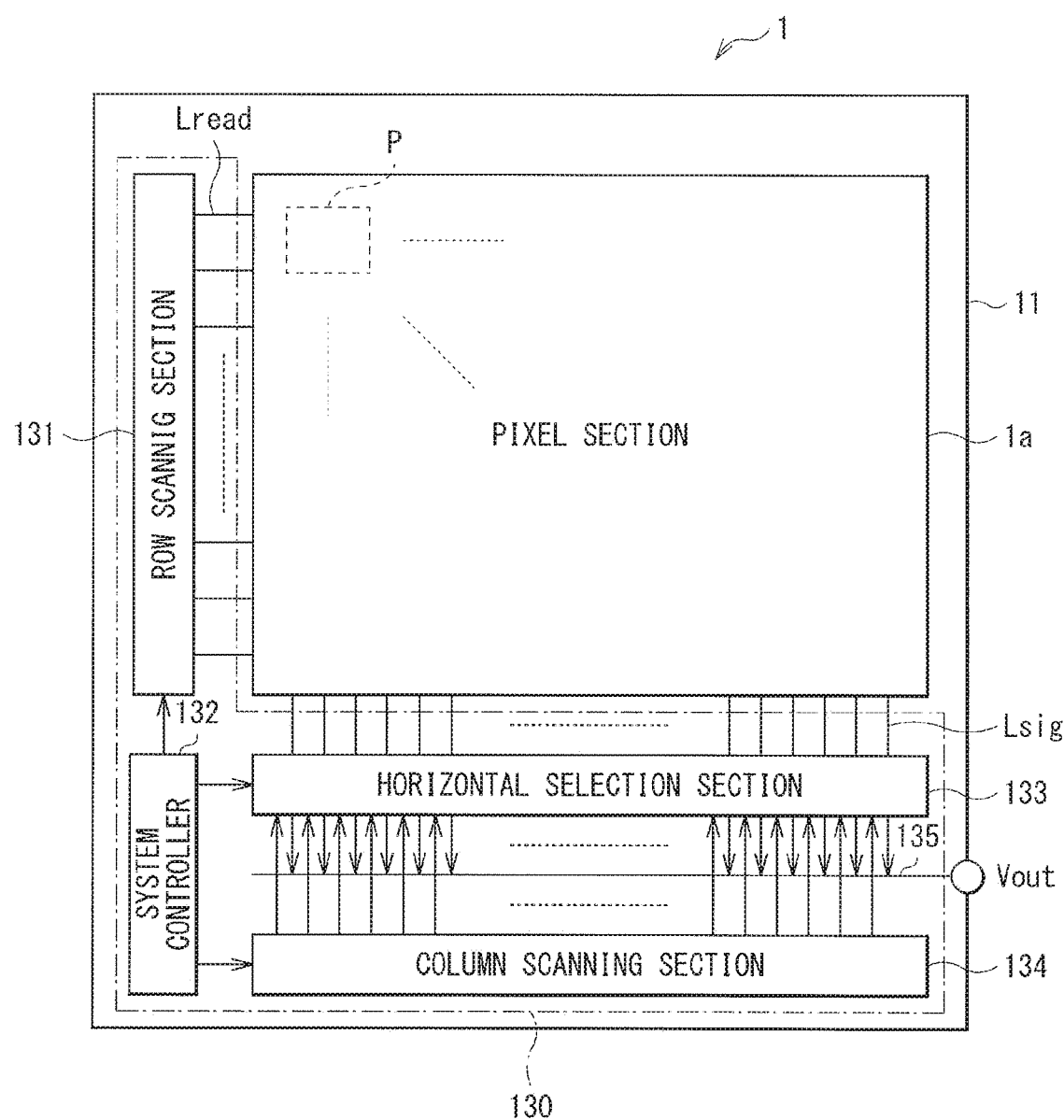

[ FIG. 12 ]
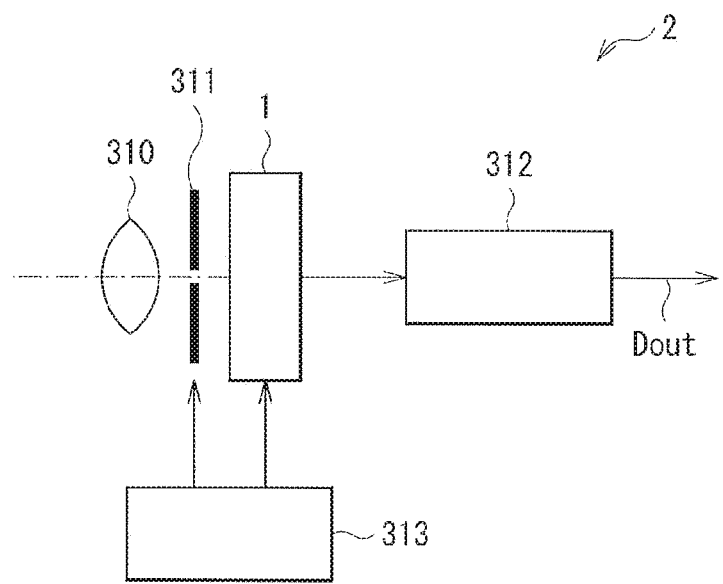
[ FIG. 13 ]
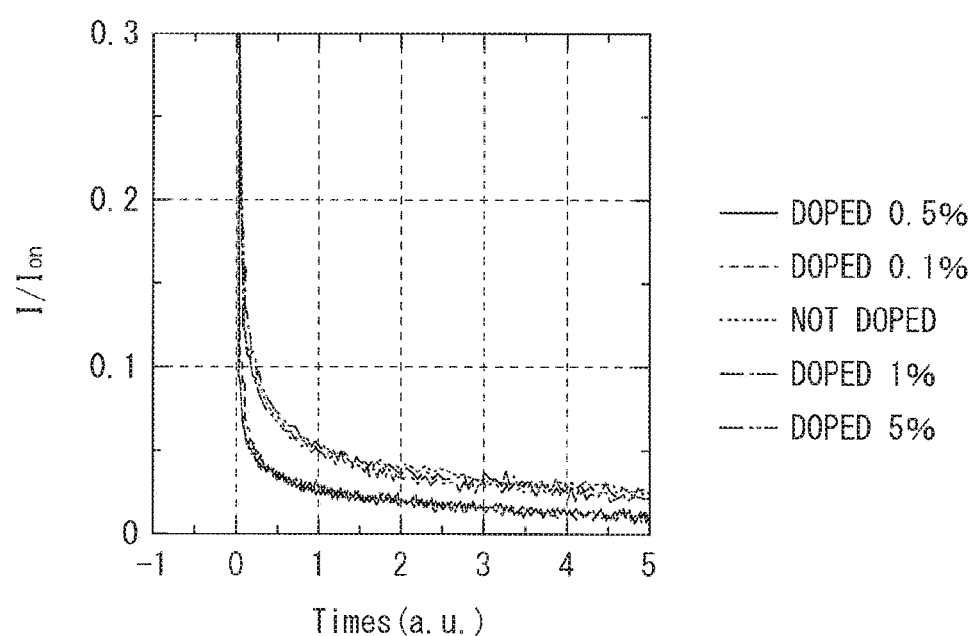

[FIG. 14]
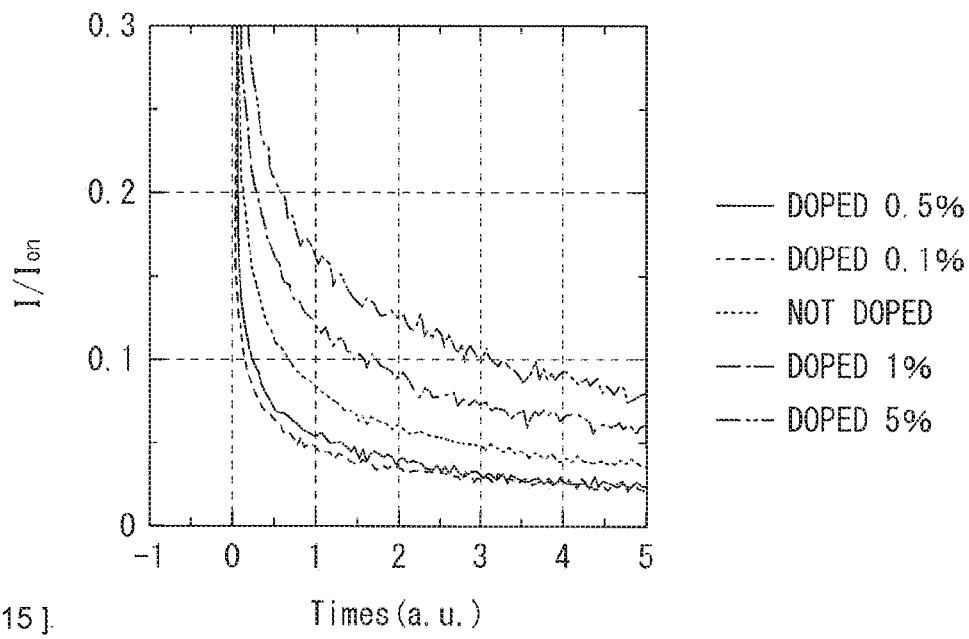
[FIG. 15]
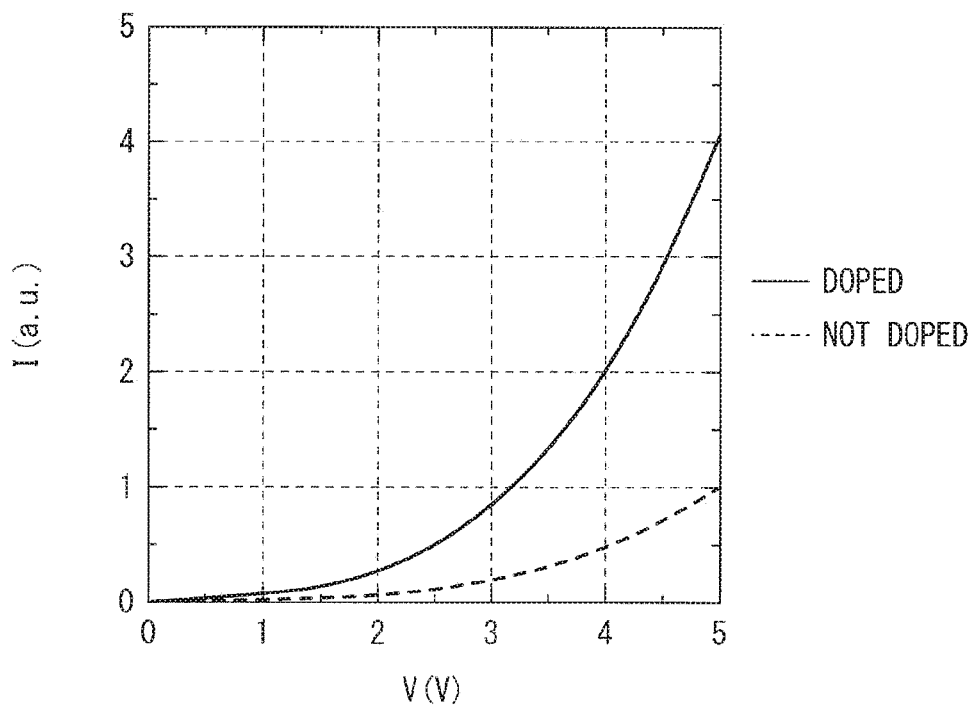

[ FIG. 16 ]
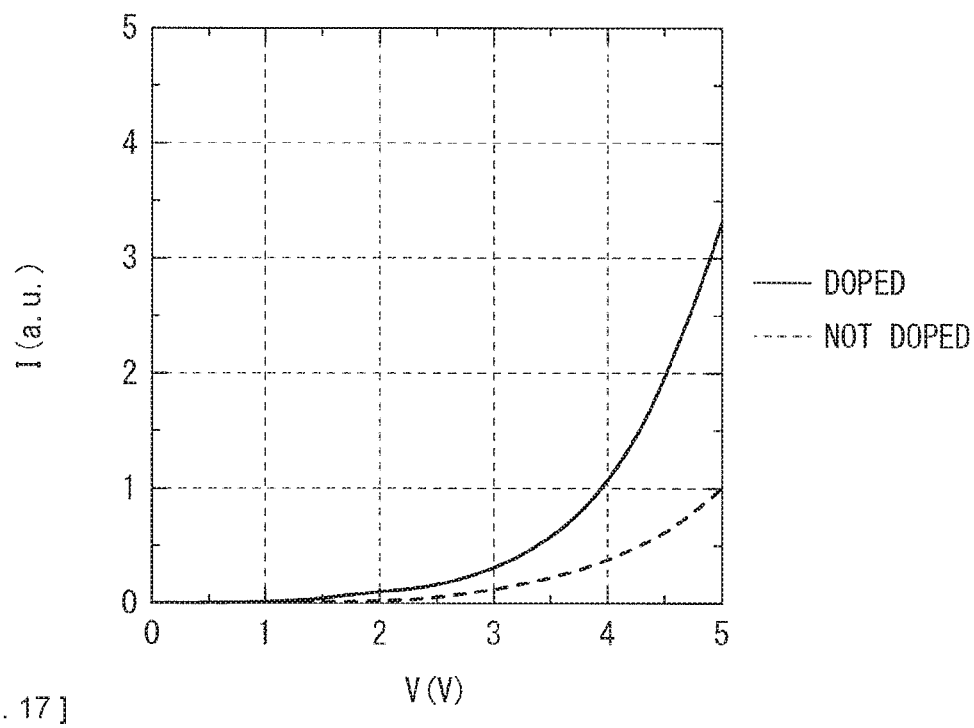
[ FIG. 17 ]
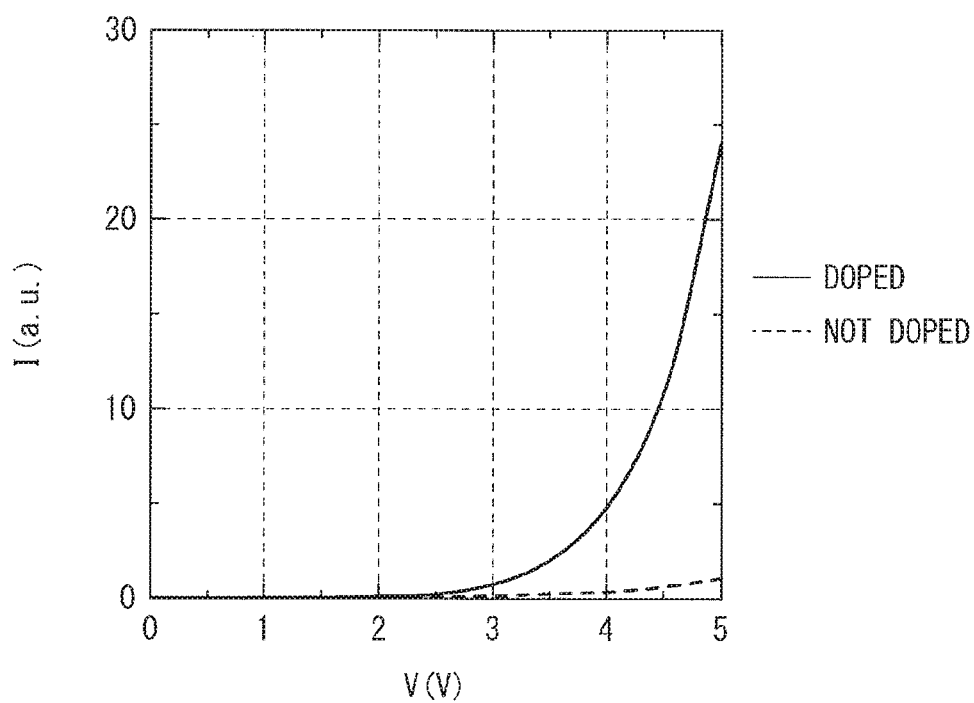

[ FIG. 18 ]
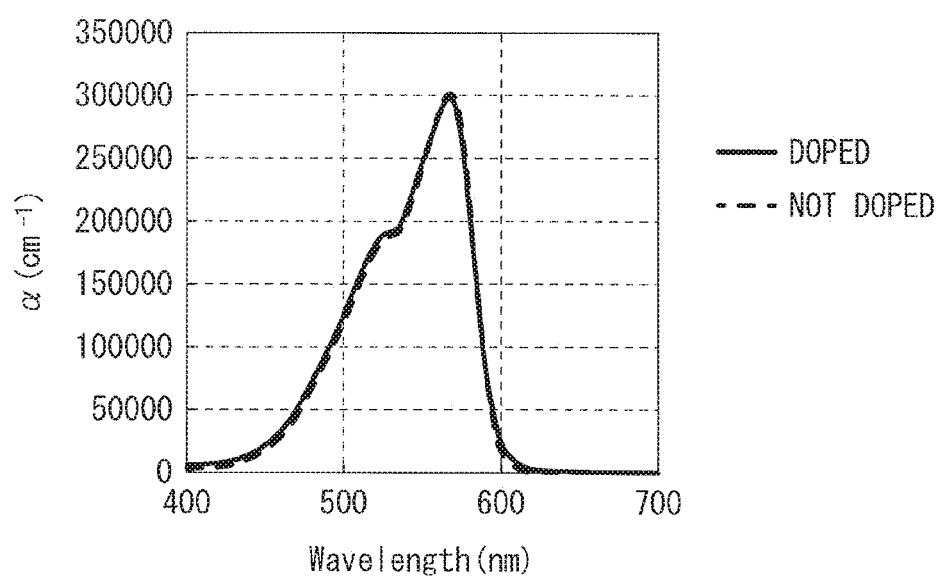

PHOTOELECTRIC CONVERSION ELEMENT, IMAGING DEVICE, AND ELECTRONIC APPARATUS COMPRISING A PHOTOELECTRIC CONVERSION LAYER HAVING AT LEAST A SUBPHTHALOCYANINE OR A SUBPHTHALOCYANINE DERIVATIVE AND A CARRIER DOPANT

CROSS REFERENCE TO RELATED APPLICATIONS

This application is a U.S. National Phase of International Patent Application No. PCT/JP2016/088926 filed on Dec. 27, 2016, which claims priority benefit of Japanese Patent Application No. JP 2016-004383 filed in the Japan Patent Office on Jan. 13, 2016 and also claims priority benefit of Japanese Patent Application No. JP 2016-062422 filed in the Japan Patent Office on Mar. 25, 2016. Each of the above-referenced applications is hereby incorporated herein by reference in its entirety.

TECHNICAL FIELD

The disclosure relates to a photoelectric conversion element and an imaging device using a subphthalocyanine or a subphthalocyanine derivative, and an electronic apparatus including the same.

BACKGROUND ART

In recent years, there has been progress in miniaturization of a pixel size in a solid-state imaging device such as a CCD (charge coupled device) image sensor or a CMOS (complementary metal oxide semiconductor) image sensor. This leads to a phenomenon in the number of photons that enter a unit pixel, thus leading to lowered sensitivity as well as a lowered S/N ratio. Further, in a case where a color filter is used in which primary color filters of red, green, and blue are two-dimensionally arrayed for colorization, pieces of light of green and blue are absorbed by the color filter, for example, in a red pixel, thus causing the sensitivity to be lowered. Further, an interpolation process is performed between pixels upon generation of each color signal, thus causing occurrence of a so-called false color.

Accordingly, for example, PTL 1 discloses an image sensor using an organic photoelectric conversion film having a multi-layer structure in which an organic photoelectric conversion film having sensitivity to blue light (B), an organic photoelectric conversion film having sensitivity to green light (G), and an organic photoelectric conversion film having sensitivity to red light (R) are sequentially stacked. In this image sensor, the sensitivity is improved by extracting each of the signals B/G/R separately from one pixel. PTL 2 discloses an imaging device in which a single organic photoelectric conversion film is formed, a signal of a single color is extracted with this organic photoelectric conversion film, and signals of two colors are extracted using a silicon (Si) bulk spectroscopy. In so-called laminated imaging devices (image sensors) disclosed in PTL 1 and PTL 2, incident light is mostly subjected to photoelectric conversion and thus read, which allows efficiency of use of visible light to be nearly 100%. Further, color signals of three colors, R, G, and B are obtained at each light-receiving unit, making it possible to generate an image with high sensitivity and high resolution (false color becomes unconspicuous).

For an organic semiconductor serving to absorb green light particularly among organic semiconductors configuring an organic photoelectric conversion film, a subphthalocyanine derivative having superior selectivity in absorption wavelength is widely used. However, the subphthalocyanine derivative is low in carrier mobility, which has caused an issue in which it is not possible to obtain sufficient photoresponse from an imaging device using the subphthalocyanine derivative.

An example of a method of improving conductivity characteristics of a carrier includes a method of doping a target layer with a carrier. For example, PTL 3 discloses a photoelectric conversion element in which transporting a carrier from an anode and a cathode to a photoelectric conversion layer is facilitated by doping with a dopant a photoelectric conversion layer containing poly[N-9'-heptadecanyl-2,7-carbazole-alt-5,5-(4',7'-di-2-thienyl-2',1',3'-benzothiadiazole)], poly[[9-(1-octylnonyl)-9H-carbazole-2,7-diyl]-2,5-thiophene diyl-2,1,3-benzothiadiazole-4,7-diyl-2,5-thiophene diyl] (PCDTBT).

CITATION LIST

Patent Literature

PTL 1: Japanese Unexamined Patent Application Publication No. 2003-234460
PTL 2: Japanese Unexamined Patent Application Publication No. 2005-303266
PTL 3: Japanese Unexamined Patent Application Publication No. 2014-107465

SUMMARY OF INVENTION

However, in a case where a photoelectric conversion layer using a subphthalocyanine derivative is simply doped with a dopant, there has been an issue of insufficient improvement of conductivity characteristics of a carrier or deterioration of the characteristics.

It is desirable to provide a photoelectric conversion element, an imaging device, and an electronic apparatus that make it possible to improve photoresponse while maintaining superior wavelength selectivity of a subphthalocyanine and a subphthalocyanine derivative.

A photoelectric conversion element according to an embodiment of the disclosure includes: a first electrode and a second electrode that are disposed to face each other; and a photoelectric conversion layer that is provided between the first electrode and the second electrode, and contains at least a subphthalocyanine or a subphthalocyanine derivative, and a carrier dopant, in which the carrier dopant has a concentration of less than 1% by volume ratio to the subphthalocyanine or the subphthalocyanine derivative.

An imaging device according to an embodiment of the disclosure is provided in which pixels each have one or a plurality of organic photoelectric conversion sections, and includes, as an organic photoelectric conversion section, the photoelectric conversion element according to the embodiment of the disclosure above.

An electronic apparatus according to an embodiment of the disclosure is provided with an imaging device, in which pixels each have one or a plurality of organic photoelectric conversion sections, and the electronic apparatus includes, as an organic photoelectric conversion section, the photoelectric conversion element according to the embodiment of the disclosure above.

In the photoelectric conversion element, the imaging device, and the electronic apparatus according to the respective embodiments of the disclosure, the photoelectric conversion layer provided between the first electrode and the second electrode that are disposed to face each other is formed using at least the subphthalocyanine or the subphthalocyanine derivative, and the carrier dopant having a concentration less than 1% by volume ratio to the subphthalocyanine or the subphthalocyanine derivative. This makes it possible to improve mobility of the carrier of the photoelectric conversion layer containing the subphthalocyanine derivative.

In the photoelectric conversion element, the imaging device, and the electronic apparatus according to the respective embodiments of the disclosure, the photoelectric conversion layer is formed using at least the subphthalocyanine or the subphthalocyanine derivative, and the carrier dopant having a concentration less than 1% (by volume ratio) to the subphthalocyanine or the subphthalocyanine derivative. This makes it possible to improve mobility of the carrier of the photoelectric conversion layer, leading to the improvement of photoresponse. It is to be noted that the effects of the disclosure are not necessarily limited to the effects described above, and may be any of the effects described in the specification.

BRIEF DESCRIPTION OF DRAWINGS

FIG. 1 is a cross-sectional view of an outline configuration of a photoelectric conversion element according to an embodiment of the disclosure.

FIG. 2 is a plan view of a positional relationship among an organic photoelectric conversion layer, a protective layer (top electrode), and a contact hole being formed.

FIG. 3A is a cross-sectional view of a configuration example of an inorganic photoelectric conversion section.

FIG. 3B is another cross-sectional view of the inorganic photoelectric conversion section illustrated in FIG. 3A.

FIG. 4 is a cross-sectional view of a configuration (extraction of electrons on lower side) of an electric charge (electron) accumulation layer of an inorganic photoelectric conversion section.

FIG. 5A is a cross-sectional view describing a method of manufacturing the photoelectric conversion element illustrated in FIG. 1.

FIG. 5B is a cross-sectional view of a step subsequent to FIG. 5A.

FIG. 6A is a cross-sectional view of a step subsequent to FIG. 5B.

FIG. 6B is a cross-sectional view of a step subsequent to FIG. 6A.

FIG. 7A is a cross-sectional view of a step subsequent to FIG. 6B.

FIG. 7B is a cross-sectional view of a step subsequent to FIG. 7A.

FIG. 7C is a cross-sectional view of a step subsequent to FIG. 7B.

FIG. 8 is a cross-sectional view of a main part describing a working of the photoelectric conversion element illustrated in FIG. 1.

FIG. 9 is a schematic diagram describing a working of the photoelectric conversion element illustrated in FIG. 1.

FIG. 10 is a cross-sectional view of a schematic configuration of a photoelectric conversion element according to a modification example of the disclosure.

FIG. 11 is a functional block diagram of an imaging device using the photoelectric conversion element illustrated in FIG. 1 as a pixel.

FIG. 12 is a block diagram of an outline configuration of an electronic apparatus (imaging unit) including the imaging device illustrated in FIG. 11.

FIG. 13 is a characteristic graph illustrating a relation between a dopant concentration and photoresponse in experiment example 1.

FIG. 14 is a characteristic graph illustrating a relation between a dopant concentration and photoresponse in experiment example 2.

FIG. 15 is an I-V characteristic graph in experiment example 3-1.

FIG. 16 is an I-V characteristic graph in experiment example 3-2.

FIG. 17 is an I-V characteristic graph in experiment example 3-3.

FIG. 18 is an absorption spectrum graph in experiment example 4.

MODES FOR CARRYING OUT THE INVENTION

In the following, some embodiments of the disclosure are described in detail with reference to drawings. It is to be noted that description is given in the following order.

1. Embodiment (a photoelectric conversion element containing a subphthalocyanine or a subphthalocyanine derivative, and a dopant in an organic photoelectric conversion layer)
 1-1. Basic Configuration
 1-2. Manufacturing Method
 1-3. Workings and Effects
2. Modification Example (a photoelectric conversion element in which a plurality of organic photoelectric conversion layers are stacked)
3. Application Examples
4. Examples 1. Embodiment FIG. 1 illustrates a cross-sectional configuration of a photoelectric conversion element (photoelectric conversion element 10) according to an embodiment of the disclosure. The photoelectric conversion element 10 constitutes a single pixel in, for example, an imaging device (described later) such as a CCD image sensor or a CMOS image sensor. The photoelectric conversion device 10 has a structure in which an organic photoelectric conversion section 11G and two inorganic photoelectric conversion sections 11B and 11R are stacked in a vertical direction. The organic photoelectric conversion section 11G and the inorganic photoelectric conversion sections 11B and 11R each selectively detect corresponding one of pieces of light of different wavelength regions to perform photoelectric conversion. Further, the photoelectric conversion element 10 includes a multi-layer wiring layer (multi-layer wiring layer 51) and pixel transistors (including later-described transfer transistors Tr1 to Tr3) formed on side of a front face (a face S2 opposite to a light-receiving face) of a semiconductor substrate 11 on which the inorganic photoelectric conversion sections 11B and 11R are provided.

According to the photoelectric conversion element 10 of the present embodiment, the organic photoelectric conversion section 11G is formed using a subphthalocyanine or a subphthalocyanine derivative and a carrier dopant.

(1-1. Basic Configuration)

The photoelectric conversion element 10 has a stacked structure of one organic photoelectric conversion section 11G and two inorganic photoelectric conversion sections 11B and 11R. This allows for obtainment of respective color signals of red (R), green (G), and blue (B) using a single element. The organic photoelectric conversion section 11G is formed on a back face (face S1) of the semiconductor substrate 11, and the inorganic photoelectric conversion sections 11B and 11R are formed to be embedded inside the semiconductor substrate 11. Description is given below of a configuration of each section.

(Organic Photoelectric Conversion Section 11G)

The organic photoelectric conversion section 11G is an organic photoelectric conversion element that uses an organic semiconductor to absorb light (here, green light) of a selective wavelength region, thus generating an electron-hole pair. The organic photoelectric conversion section 11G has a configuration in which an organic photoelectric conversion layer 17 is interposed between a pair of electrodes (bottom electrode 15a and top electrode 18) that extract a signal electric charge. As described later, the bottom electrode 15a and the top electrode 18 are electrically coupled to electrically-conductive plugs 120a1 and 120b1 each embedded inside the semiconductor substrate 11, through a wiring layer and a contact metal layer.

Specifically, in the organic photoelectric conversion section 11G, interlayer insulating films 12 and 14 are formed on the face S1 of the semiconductor substrate 11. The interlayer insulating film 12 has through-holes provided in respective regions that face the later-described electrically-conductive plugs 120a1 and 120b1. Electrically-conductive plugs 120a2 and 120b2 are embedded in the respective through-holes. In the interlayer insulating film 14, wiring layers 13a and 13b are embedded in respective regions that face the electrically-conductive plugs 120a2 and 120b2. The bottom electrode 15a and a wiring layer 15b electrically separated from the bottom electrode 15a by the insulating film 16 are provided on the interlayer insulating film 14. Among those, the organic photoelectric conversion layer 17 is formed on the bottom electrode 15a, and the top electrode 18 is so formed as to cover the organic photoelectric conversion layer 17. A protective layer 19 is so formed on the top electrode 18 as to cover a face of the top electrode 18, although the detail is described later. A contact hole H is provided in a predetermined region of the protective layer 19. A contact metal layer 20 is formed on the protective layer 19 which fills the contact hole H and extends up to an upper face of the wiring layer 15b.

The electrically-conductive plug 120a2, together with the electrically-conductive plug 120a1 and the wiring layer 13a, functions as a connector together with the electrically-conductive plug 120a1, and forms a transmission path of an electric charge (electron) from the bottom electrode 15a to a later-described electricity storage layer for green 110G. The electrically-conductive plug 120b2 functions as a connector together with the electrically-conductive plug 120b1, and forms, together with the electrically-conductive plug 120b1, the wiring layer 13b, the wiring layer 15b, and the contact metal layer 20, a discharge path of an electric charge (hole) from the top electrode 18. The electrically-conductive plugs 120a2 and 120b2 are desirably configured by, for example, a stacked film of a metal material such as titanium (Ti), titanium nitride (TiN), and tungsten, in order to allow the electrically-conductive plugs 120a2 and 120b2 to function also as a light-shielding film. Further, the use of such a stacked film is desirable because this enables a contact with silicon to be secured also in a case where the electrically-conductive plugs 120a1 and 120b1 are each formed as an n-type or p-type semiconductor layer.

The interlayer insulating film 12 is desirably configured by an insulating film having a small interface state in order to reduce the interface state with the semiconductor substrate 11 (silicon layer 110) and to suppress occurrence of a dark current from an interface with the silicon layer 110. As such an insulating film, for example, a stacked film of a hafnium oxide ($HfO_2$) film and a silicon oxide ($SiO_2$) film may be used. The interlayer insulating film 14 is configured by a monolayer film containing one of silicon oxide, silicon nitride, and silicon oxynitride (SiON), for example, or alternatively is configured by a stacked film containing two or more thereof.

The insulating film 16 is configured by a monolayer film containing one of silicon oxide, silicon nitride, and silicon oxynitride (SiON), for example, or alternatively is configured by a stacked film containing two or more thereof. The insulating film 16 has a planarized face, for example, and has a substantially stepless shape and pattern with respect to the bottom electrode 15a. The insulating film 16 has a function of electrically separating the bottom electrodes 15a of the respective pixels from one another in a case where the photoelectric conversion element 10 is used as a pixel of the solid-state imaging device.

The bottom electrode 15a is provided at a region that faces light-receiving faces of the inorganic photoelectric conversion sections 11B and 11R formed inside the semiconductor substrate 11 and covers the light-receiving faces. The bottom electrode 15a is configured by an electrically-conductive film having light-transmissivity, and includes ITO (indium tin oxide), for example. However, as a constituent material of the bottom electrode 15a, a dopant-doped tin oxide ($SnO_2$)-based material or a zinc oxide-based material in which aluminum zinc oxide (ZnO) is doped with a dopant may be used, besides the ITO. Examples of the zinc oxide-based material include aluminum zinc oxide (AZO) doped with aluminum (Al) as a dopant, gallium (Ga)-doped gallium zinc oxide (GZO), and indium (In)-doped indium zinc oxide (IZO). Aside from those described above, for example, CuI, $InSbO_4$, ZnMgO, $CuInO_2$, $MgIN_2O_4$, CdO, and $ZnSnO_3$ may be used. It is to be noted that, in the present embodiment, a signal electric charge (electron) is extracted from the bottom electrode 15a. Therefore, in the later-described solid-state imaging device using the photoelectric conversion element 10 as a pixel, this bottom electrode 15a is formed in a manner to be separated on a pixel-by-pixel basis.

The organic photoelectric conversion layer 17 includes either one or both of an organic p-type semiconductor and an organic n-type semiconductor, and allows for transmission of light of another wavelength region while subjecting light of a selective wavelength region to photoelectric conversion. Here, the organic photoelectric conversion layer 17 has a maximum absorption wavelength in a range of no less than 450 nm and no more than 650 nm, for example.

In the present embodiment, the organic photoelectric conversion layer 17 is formed using a subphthalocyanine or a subphthalocyanine derivative represented by the following formulae (5) or (6), for example, and a carrier dopant. The carrier dopant provides a carrier to the subphthalocyanine or the subphthalocyanine derivative in the organic photoelectric conversion layer 17, to thereby improve the conductivity of the carrier in the organic photoelectric conversion layer 17.

[Chem. 1]

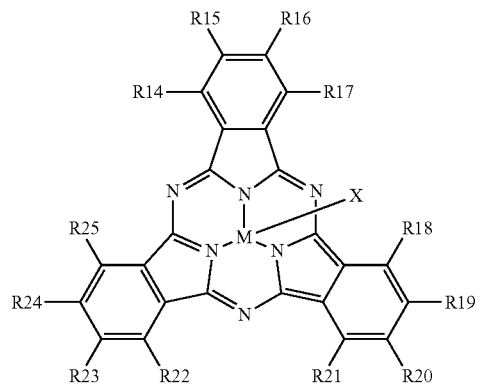

(5)

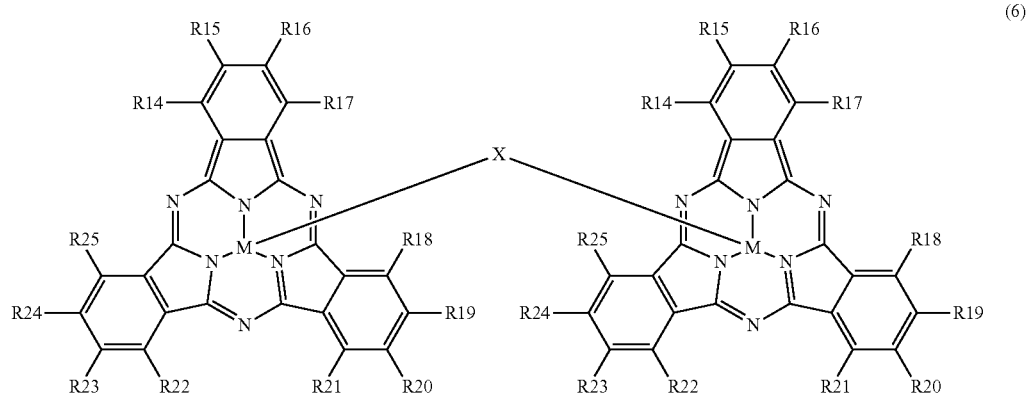

(6)

(where R14 to R25 and X denote, each independently: hydrogen atom; halogen atom; a linear chain, branched, or cyclic alkyl group; thioalkyl group; thioaryl group; arylsulfonyl group; alkylsulfonyl group; amino group; alkylamino group; arylamino group; hydroxy group; alkoxy group; acylamino group; acyloxy group; phenyl group; carboxy group; carboxoamide group; carboalkoxy group; acyl group; sulfonyl group; cyano group; nitro group; heterocyclic group; or a derivative thereof. Any mutually adjacent R14 to R25 may form a cycle by bonding with each other. M denotes boron, or a divalent or trivalent metal.)

Specific examples of the subphthalocyanine or the subphthalocyanine derivative represented by the above formulae (5) and (6) include the following formulae (5-1) to (5-14), and the formulae (6-1) and (6-2).

[Chem. 2]

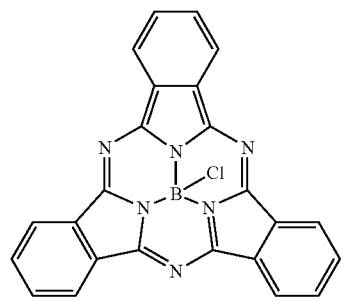

(5-1)

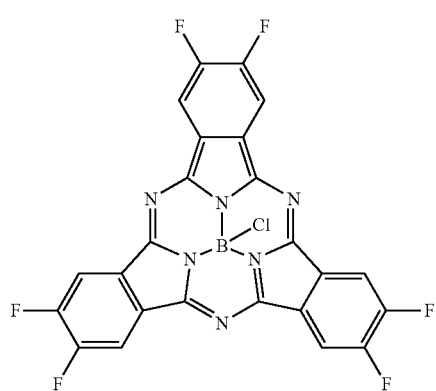

(5-2)

-continued
(5-3)
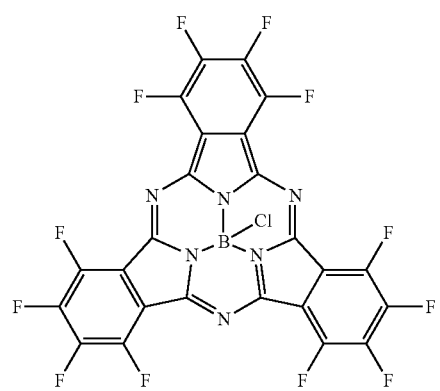
(5-4)
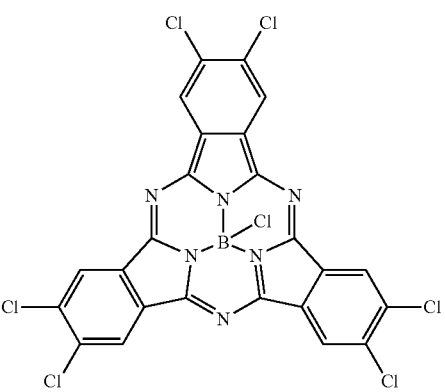
(5-5)
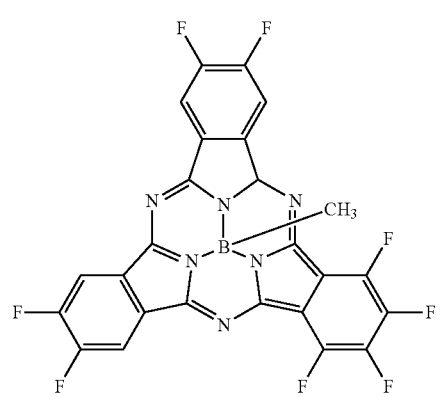
(5-6)
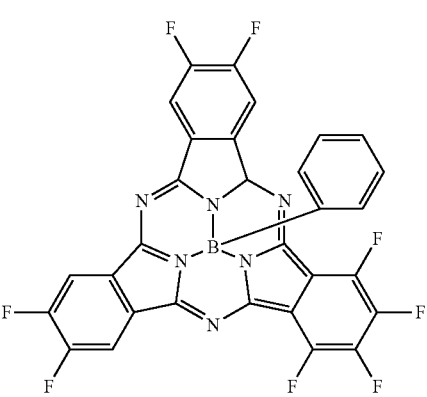
(5-7)
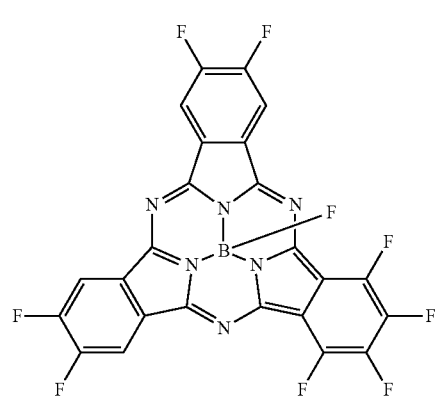
(5-8)
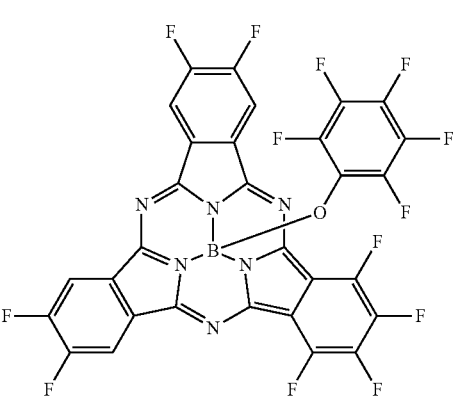
[Chem. 3]
(5-9)
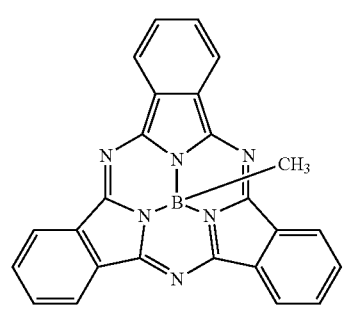
(5-10)
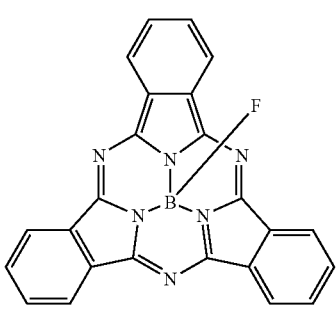

-continued

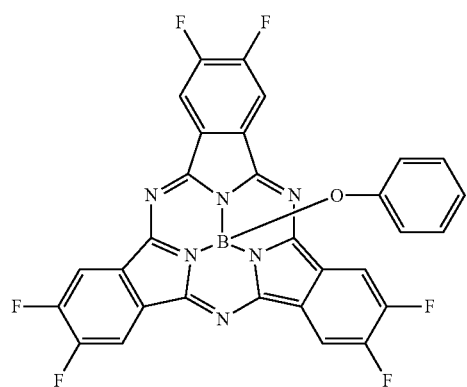
(5-11)

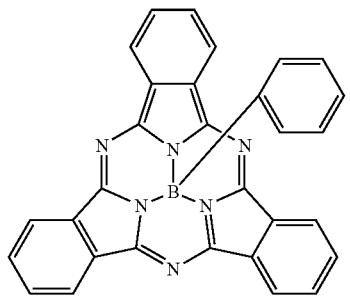
(5-12)

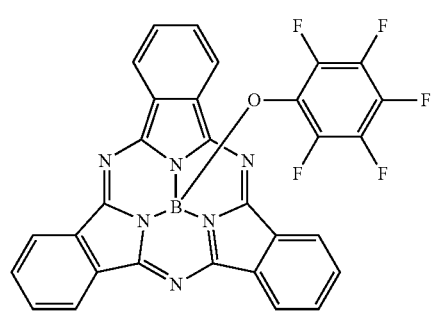
(5-13)

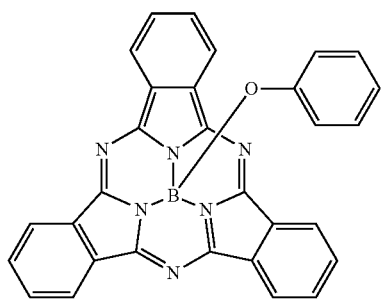
(5-14)

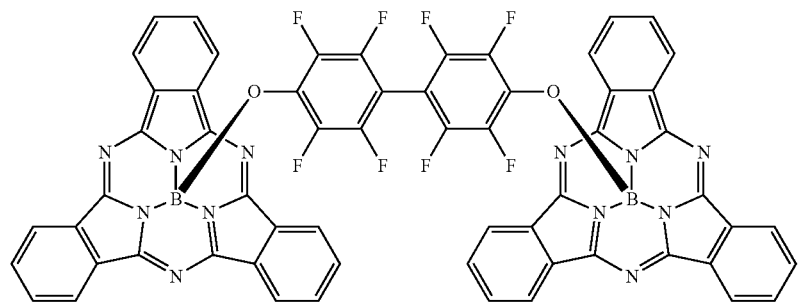
(6-1)

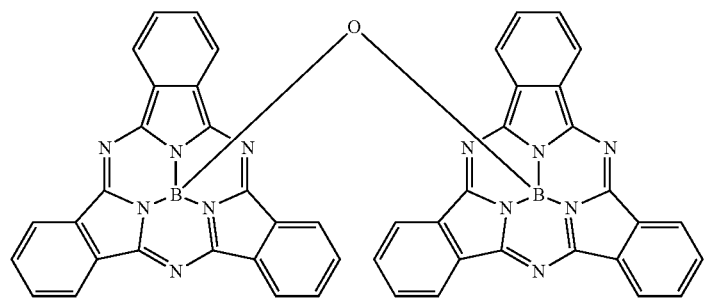
(6-2)

The carrier dopant is preferably an organic material. The organic material has high stability in air and is larger in molecular size as well. Therefore, diffusion of a carrier dopant after discharging the carrier is suppressed, making it possible to prevent a characteristic defect from occurring. Furthermore, in a case where the subphthalocyanine or the subphthalocyanine derivative functions as an n-type semiconductor in the organic photoelectric conversion layer 17, it is preferable to select a dopant that is able to donate electrons to the subphthalocyanine or the subphthalocyanine derivative, i.e. select an organic material that functions as an electron dopant. An electron dopant with superior stability in air has a deep HOMO level and involves difficulty in oxidization in the atmosphere, and is accompanied with, upon doping, a chemical reaction, or an elimination reaction or an addition reaction of, for example, hydrogen, carbon oxide, nitrogen, or hydroxyl radical. Herein, a chemical reaction refers to a reaction accompanied with breaking or generating of a chemical bond. Examples of such an electron dopant include a triphenylmethane derivative represented by the following formula (1), an acridine derivative represented by the following formula (2), a xanthenes derivative represented by the following formula (3), and a benzimidazole derivative represented by the following formula (4). At least one of these electron dopants is preferably used for the organic photoelectric conversion layer 17 according to the present embodiment.

[Chem. 4]

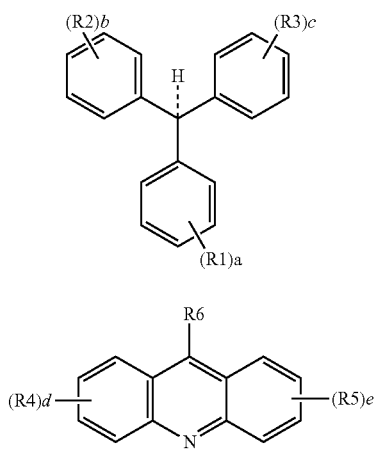

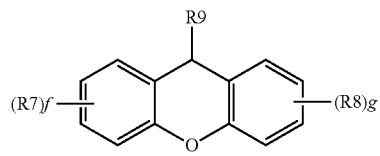

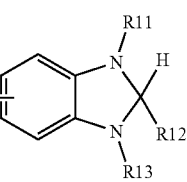

(where R1 to R13 denote, each independently: hydrogen atom; halogen atom; a linear chain, branched, or cyclic alkyl group; thioalkyl group; thioaryl group; arylsulfonyl group; alkylsulfonyl group; amino group; alkylamino group; arylamino group; hydroxy group; alkoxy group; acylamino group; acyloxy group; phenyl group; carboxy group; carboxoamide group; carboalkoxy group; acyl group; sulfonyl group; cyano group; and nitro group; or a derivative thereof. Further, R1 to R13 may form a cycle by bonding with each other and a to h are each an integer of 0 or more.)

Examples of the electron dopants represented by the above formulae (1) to (4) include the following formulae (1-1), (1-2), (2-1), (3-1), (3-2), and (4-1) to (4-3).

[Chem. 5]

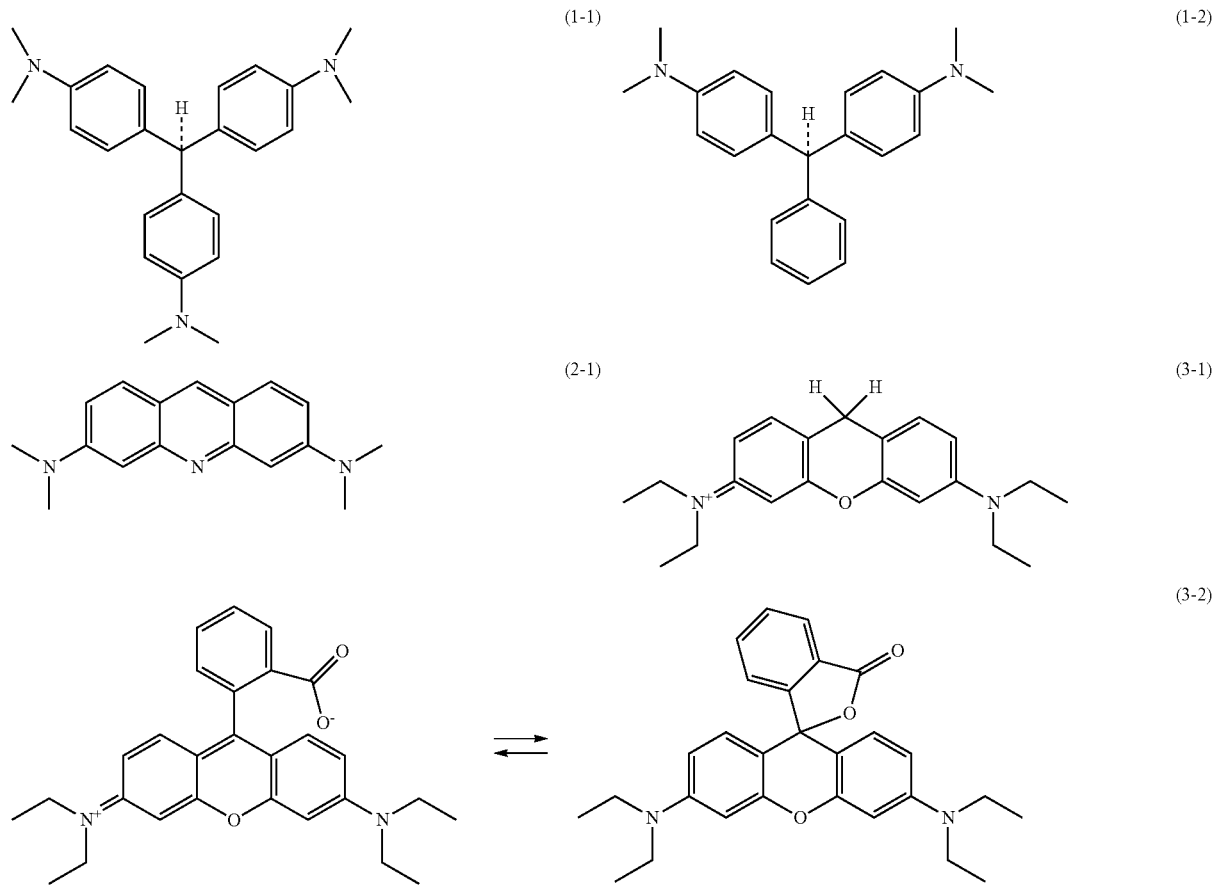

(4-1)
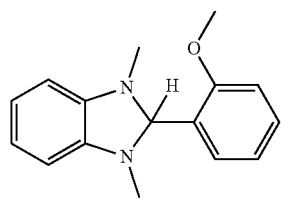

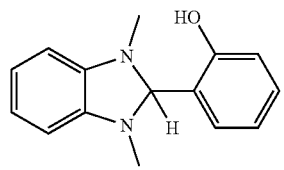

(4-2)
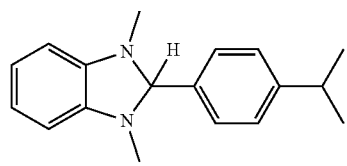

(4-3)

It is to be noted that it is possible to form the organic photoelectric conversion layer 17, for example, using a coating method or a vapor deposition method; however, in a case of forming using a vapor deposition method in particular, it is possible to use a precursor of the above-described materials. Examples of the precursors of the above formulae (1-1), (1-2), (2-1), (3-1), (3-2), and (4-1) to (4-3) include the following formulae (1-1'), (1-2'), (2-1'), (3-1'), (3-2'), and (4-1') to (4-3').

[Chem. 6]

(1-1')
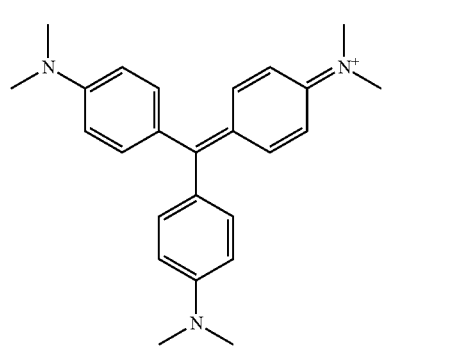

(1-2')
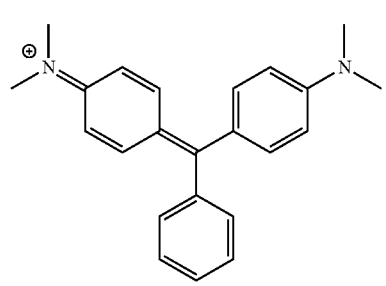

(2-1')
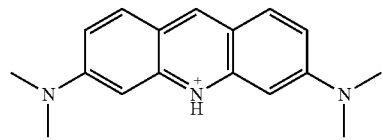

(3-1')
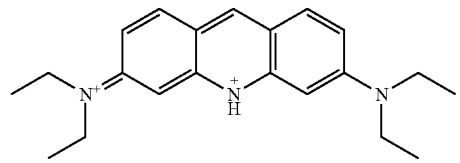

(3-2')
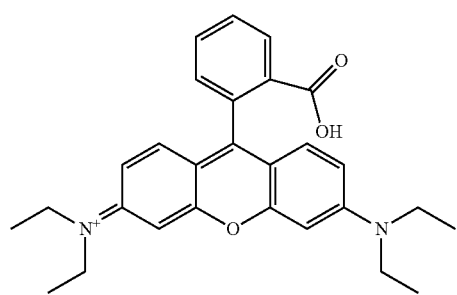

(4-1')
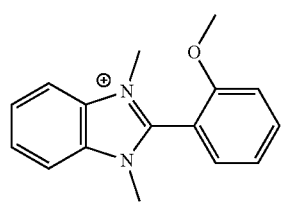

(4-2')
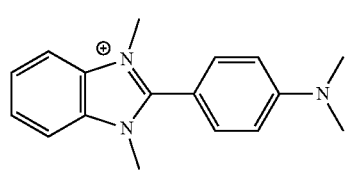

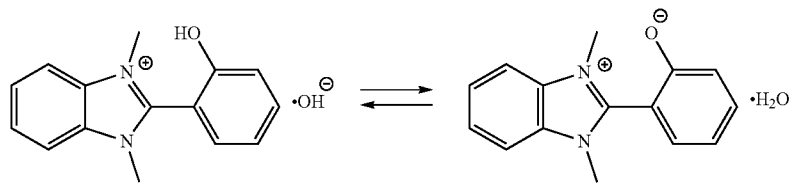

(4-3')

It is to be noted that, specifically, the precursors of the above-described electron dopants are transformed to the electron dopants represented by the above formulae (1-1), (1-2), (2-1), (3-1), (3-2), and (4-1) to (4-3), for example, through the following processes. Description is given by exemplifying a chloride, which is a precursor of crystal violet, represented by the formula (1-1'), for example. First, a vapor deposition boat containing a chloride of crystal violet is heated. Hydrogen (H) is added to the chloride of crystal violet in the vapor evaporation boat for reduction, to thereby generate leuco salt of crystal violet (formula (1-1)). The mixing of the leuco salt of crystal violet with the subphthalocyanine or the subphthalocyanine derivative allows for working as an electron dopant. Specifically, electrons are discharged and H is eliminated, to thereby generate cation of crystal violet.

For the doping amount of a carrier dopant, the dopant concentration (by volume ratio) to the subphthalocyanine or the subphthalocyanine derivative in the organic photoelectric conversion layer 17, for example, is preferably less than 1%. Although described in detailed later, in a case where the dopant concentration is no less than 1%, conductivity of a carrier in the organic photoelectric conversion layer 17 may not be improved, and further, the conductivity of the carrier may be lowered, leading to deterioration of photoresponse. It is noted that, in a case where two or more kinds of carrier dopants (electron dopants) described above are combined and used, for example, the total dopant concentration combining all the carrier dopants used for the organic photoelectric conversion layer 17 to the subphthalocyanine or the subphthalocyanine derivative is preferably less than 1%. The conversion from volume ratio to mole ratio is calculated by the following expression.

(m=Ddopant÷Mdopant)÷(Dhost÷Mhost)×V(Numerical Expression 1)

(m: mole concentration, M: molecular weight (g/mol), D: film density (g/cm$^3$), V: volume concentration)

For the organic photoelectric conversion layer 17, it is preferable to further use, as a p-type semiconductor, a quinacridone or a derivative thereof represented by the following formulae (7-1) and (7-2). Use of the subphthalocyanine or the subphthalocyanine derivative, and a carrier dopant, as well as the quinacridone or the derivative thereof allows for the improvement of separation efficiency of exciton and the increase of photoelectric current. Further, efficiency of electron transport as well as efficiency of hole transport are secured, to thereby ensure the conductivity of electrons and holes. Further, for the organic photoelectric conversion layer 17, it is preferable to further use, as an n-type semiconductor, a fullerene or a derivative thereof. Use of the fullerene or the derivative thereof makes it possible to improve efficiency of electron transport.

[Chem. 7]

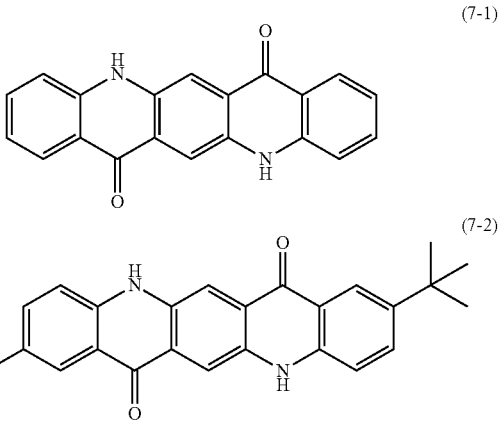

It is to be noted that the subphthalocyanine or the subphthalocyanine derivative may function as a p-type semiconductor, depending on a combination of materials constituting the organic photoelectric conversion layer 17. In such a case, for a carrier dopant, it is preferable to select a dopant that is able to donate holes to the subphthalocyanine or the subphthalocyanine derivative, i.e. select an organic material that functions as a hole dopant. Examples of such a material include a tetracyanoquinodimethane derivative, a tetracyanonaphtoquinodimethane derivative, and a fullerene fluoride derivative.

Any other unillustrated layer may be provided between the organic photoelectric conversion layer 17 and the bottom electrode 15a and between the organic photoelectric conversion layer 17 and the top electrode 18. For example, an underlying film, a hole transport layer, an electron blocking film, the organic photoelectric conversion layer 17, a hole blocking film, a buffer film, an electron transport layer, and a work function adjustment film may be stacked in order from side of the bottom electrode 15a.

The top electrode 18 is configured by the electrically-conductive film having light-transmissivity similarly to that of the bottom electrode 15a. In the solid-state imaging device using the photoelectric conversion element 10 as a pixel, the top electrode 18 may be separated on a pixel-by-pixel basis, or may be formed as an electrode common to the respective pixels. The top electrode 18 has a thickness of 10 nm to 200 nm, for example.

The protective layer 19 includes a material having light-transmissivity, and is, for example, a monolayer film containing one of silicon oxide, silicon nitride, and silicon oxynitride, or alternatively is a stacked film containing two or more thereof. The protective layer 19 has a thickness of 100 nm to 30000 nm, for example.

The contact metal layer 20 is configured by a stacked film containing one of titanium, tungsten, titanium nitride, and aluminum, for example, or alternatively two or more thereof.

The top electrode 18 and the protective film 19 are so provided as to cover the organic photoelectric conversion layer 17, for example. FIG. 2 illustrates a planar configuration of the organic photoelectric conversion layer 17, the protective film 19 (top electrode 18), and the contact hole H.

Specifically, a peripheral part e2 of the protective layer 19 (applicable likewise to the top electrode 18) is located outside a peripheral part e1 of the organic photoelectric conversion layer 17. The protective layer 19 and the top electrode 18 are formed to be expanded outward beyond the organic photoelectric conversion layer 17. In detail, the top electrode 18 is so formed as to cover an upper face and side faces of the organic photoelectric conversion layer 17 and to extend up to a portion on the insulating film 16. The protective layer 19 is formed to cover an upper face of such a top electrode 18 and to have a planar shape equivalent to that of the top electrode 18. The contact hole H is provided in a non-opposed region to the organic photoelectric conversion layer 17, of the protective layer 19 (region outside the peripheral part e1), causing a portion of a surface of the top electrode 18 to be exposed. A distance between the peripheral part e1 and the peripheral part e2 is, for example, 1 µm to 500 µm, although the distance is not particularly limited. It is to be noted that, although FIG. 2 illustrates a single rectangular contact hole H provided along an edge side of the organic photoelectric conversion layer 17, the shape and the number of the contact hole H are not limited thereto; other shapes (e.g., circular shape and square shape) may be adopted, and a plurality of contact holes H may be provided.

A planarization layer 21 is so formed on the protective layer 19 and the contact metal layer 20 as to cover the whole face. An on-chip lens 22 (microlens) is provided on the planarization layer 21. The on-chip lens 22 condenses light incident from above to each light-receiving face of the organic photoelectric conversion section 11G, and the inorganic photoelectric conversion sections 11B and 11R. In the present embodiment, the multi-layer wiring layer 51 is formed on side of the face S2 of the semiconductor substrate 11, thus making it possible to allow the respective light-receiving faces of the organic photoelectric conversion section 11G and the inorganic photoelectric conversion sections 11B and 11R to be disposed closer to one another. Thus, it becomes possible to reduce a variation in sensitivity among respective colors occurring depending on an F value of the on-chip lens 22.

It is to be noted that, in the photoelectric conversion element 10 according to the present embodiment, a signal electric charge (electron) is extracted from the bottom electrode 15*a*, and thus the solid-state imaging device using the photoelectric conversion element 10 as a pixel may adopt the top electrode 18 as a common electrode. In this case, the above-described transmission path including the contact hole H, the contact metal layer 20, the wiring layers 15*b* and 13*b*, and the electrically-conductive plugs 120*b*1 and 120*b*2 may be formed at at least one location for all the pixels.

In the semiconductor substrate 11, for example, the inorganic photoelectric conversion sections 11B and 11R and the electricity storage layer for green 110G are formed to be embedded in a predetermined region of the n-type silicon (Si) layer 110. Further, the electrically-conductive plugs 120*a*1 and 120*b*1 are embedded in the semiconductor substrate 11. The electrically-conductive plugs 120*a*1 and 120*b*1 serve as a transmission path of an electric charge (electron or hole (hole)) from the organic photoelectric conversion section 11G. In the present embodiment, the back face (face S1) of the semiconductor substrate 11 serves as a light-receiving face. On side of the front face (face S2) of the semiconductor substrate 11, a plurality of pixel transistors (including transfer transistors Tr1 to Tr3) corresponding, respectively, to the organic photoelectric conversion section 11G and the inorganic photoelectric conversion sections 11B and 11R, are formed, and a peripheral circuit configured by a logic circuit, etc., is formed.

Examples of the pixel transistors include a transfer transistor, a reset transistor, an amplifying transistor, and a selection transistor. Each of these pixel transistors is configured, for example, by a MOS transistor, and is formed in a p-type semiconductor well region on side of the face S2. A circuit that includes such pixel transistors is formed for each of the photoelectric conversion sections of red, green, and blue. Each of the circuits may have a three-transistor configuration that includes three transistors in total, configured by the transfer transistor, the reset transistor, and the amplifying transistor, for example, among these pixel transistors. Alternatively, each of the circuits may have a four-transistor configuration that includes the selection transistor in addition thereto. Here, illustration and description are given only of the transfer transistors Tr1 to Tr3 among these pixel transistors. Further, the pixel transistor other than the transfer transistors may be shared by the photoelectric conversion sections or by the pixels. Furthermore, a so-called pixel-shared structure may also be applied in which a floating diffusion is shared.

The transfer transistors Tr1 to Tr3 each include a gate electrode (gate electrode TG1, TG2, or TG3) and a floating diffusion (FD113, FD114, or FD116). The transfer transistor Tr1 transfers, to a later-described vertical signal line Lsig, a signal electric charge (electron, in the present embodiment) corresponding to a green color that is generated in the organic photoelectric conversion section 11G and is accumulated in the electricity storage layer for green 110G. The transfer transistor Tr2 transfers, to the later-described vertical signal line Lsig, a signal electric charge (electron, in the present embodiment) corresponding to a blue color that is generated in the inorganic photoelectric conversion section 11B and is accumulated. Likewise, the transfer transistor Tr3 transfers, to the later-described vertical signal line Lsig, a signal electric charge (electron, in the present embodiment) corresponding to a red color that is generated in the inorganic photoelectric conversion section 11R and is accumulated.

The inorganic photoelectric conversion sections 11B and 11R are each a photodiode (Photo Diode) that has a p-n junction. The inorganic photoelectric conversion sections 11B and 11R are formed in order from side of the face S1 on an optical path in the semiconductor substrate 11. Among these, the inorganic photoelectric conversion section 11B selectively detects blue light and accumulates a signal electric charge corresponding to the blue color. The inorganic photoelectric conversion section 11B is formed to extend, for example, from a selective region along the face S1 of the semiconductor substrate 11 to a region near an interface with the multi-layer wiring layer 51. The inorganic photoelectric conversion section 11R selectively detects red light and accumulates a signal electric charge corresponding to the red color. The inorganic photoelectric conversion section 11R is formed, for example, in a region in a lower layer (on face S2 side) than the inorganic photoelectric conversion section 11B. It is to be noted that the blue (B) is a color that corresponds to a wavelength region from 450 nm to 495 nm, for example, and the red (R) is a color that corresponds to a wavelength region from 620 nm to 750 nm, for example. It is acceptable so long as the inorganic photoelectric conversion sections 11B and 11R are able to detect light of a portion or all of the respective wavelength regions described above.

FIG. 3A illustrates a detailed configuration example of the inorganic photoelectric conversion sections 11B and 11R. FIG. 3B corresponds to a configuration in another cross-section in FIG. 3A. It is to be noted that, in the present embodiment, description is given of a case where, among a pair of an electron and a hole generated by photoelectric conversion, the electron is read as a signal electric charge (case where an n-type semiconductor region serves as a photoelectric conversion layer). Further, in the drawing, "+(plus)" in a superscript manner attached to "p" or "n" indicates that p-type or n-type impurity concentration is high. Furthermore, among the pixel transistors, the gate electrodes TG2 and TG3 of the transfer transistors Tr2 and Tr3 are also illustrated.

The inorganic photoelectric conversion section 11B includes, for example, a p-type semiconductor region (hereinafter, simply referred to as "p-type region", applicable likewise to the case of n-type) 111$p$ to serve as a hole accumulation layer, and an n-type photoelectric conversion layer (n-type region) 111$n$ to serve as an electron accumulation layer. The p-type region 111$p$ and the n-type photoelectric conversion layer 111$n$ are each formed in a selective region near the face S1. A portion of each of the p-type region 111$p$ and the n-type photoelectric conversion layer 111$n$ is bent and so formed and extend as to reach the interface with the face S2. The p-type region 111$p$ is coupled to an unillustrated p-type semiconductor well region on side of the face S1. The n-type photoelectric conversion layer 111$n$ is coupled to the FD113 (n-type region) of the transfer transistor Tr2 for the blue color. It is to be noted that a p-type region 113$p$ (hole accumulation layer) is formed near an interface between the face S2 and each of the end portions of the p-type region 111$p$ and the n-type photoelectric conversion layer 111$n$ on side of the face S2.

The inorganic photoelectric conversion section 11R is formed, for example, between p-type regions 112$p$1 and 112$p$2 (hole accumulation layers), with an n-type photoelectric conversion layer 112$n$ (electron accumulation layer) being interposed therebetween (having a p-n-p stacked structure). A portion of the n-type photoelectric conversion layer 112$n$ is bent and so formed and extend as to reach the interface with the face S2. The n-type photoelectric conversion layer 112$n$ is coupled to the FD 114 (n-type region) of the transfer transistor Tr3 for the red color. It is to be noted that the p-type region 113$p$ (hole accumulation layer) is formed at least near the interface between the face S2 and an end portion of the n-type photoelectric conversion layer 111$n$ on side of the face S2.

FIG. 4 illustrates a detailed configuration example of the electricity storage layer for green 110G. It is to be noted that description is given here of a case where, between a pair of an electron and a hole generated by the organic photoelectric conversion section 11G, the electron is read as a signal electric charge from side of the bottom electrode 15$a$. Further, FIG. 4 also illustrates the gate electrode TG1 of the transfer transistor Tr1 between the pixel transistors.

The electricity storage layer for green 110G includes an n-type region 115$n$ that serves as an electron accumulation layer. A portion of the n-type region 115$n$ is coupled to the electrically-conductive plug 120$a$1, and accumulates electrons supplied from side of the bottom electrode 15$a$ via the electrically-conductive plug 120$a$1. The n-type region 115$n$ is also coupled to the FD 116 (n-type region) of the transfer transistor Tr1 for the green color. It is to be noted that a p-type region 115$p$ (hole accumulation layer) is formed near an interface between the n-type region 115$n$ and the face S2.

The electrically-conductive plugs 120$a$1 and 120$b$1, together with the later-described electrically-conductive plugs 120$a$2 and 120$b$2, each function as a connector between the organic photoelectric conversion section 11G and the semiconductor substrate 11, and forms a transmission path for electrons or holes generated in the organic photoelectric conversion section 11G. In the present embodiment, the electrically-conductive plug 120$a$1 is in electric conduction with the bottom electrode 15$a$ of the organic photoelectric conversion section 11G, and is coupled to the electricity storage layer for green 110G. The electrically-conductive plug 120$b$1 is electrically conducted to the top electrode 18 of the organic photoelectric conversion section 11G, and serves as a wiring line for discharge of holes.

These electrically-conductive plugs 120$a$1 and 120$b$1 are each configured, for example, by an electrically-conductive type semiconductor layer, and are each formed to be embedded in the semiconductor substrate 11. In this case, the electrically-conductive plug 120$a$1 may be of an n-type (because it serves as the transmission path of electrons). The electrically-conductive plug 120$b$1 may be of a p-type (because it serves as the transmission path of holes). Alternatively, the electrically-conductive plugs 120$a$1 and 120$b$1 may each include, for example, an electrically-conductive film material such as tungsten embedded in a through-via. In this case, for example, in order to suppress short circuit with silicon, a side face of the via is desirably covered with an insulating film containing a material such as silicon oxide ($SiO_2$) or silicon nitride (SiN).

The multi-layer wiring layer 51 is formed on the face S2 of the semiconductor substrate 11. In the multi-layer wiring layer 51, a plurality of wiring lines 51$a$ are provided through an interlayer insulating film 52. In this manner, the multi-layer wiring layer 51 is formed on side opposite to the light-receiving face in the photoelectric conversion element 10, which makes it possible to achieve a so-called backside illumination type solid-state imaging device. A support substrate 53 containing silicon, for example, is joined to the multi-layer wiring layer 51.

(1-2. Manufacturing Method)

For example, it is possible to manufacture the photoelectric conversion element 10 as follows. FIGS. 5A, 5B, 6A, 6B, 7A, 7B, and 7C illustrate a manufacturing method of the photoelectric conversion element 10 in order of steps. It is to be noted that FIGS. 7A, 7B, and 7C illustrate only a configuration of a main part of the photoelectric conversion element 10. It is to be noted that a method of fabricating the photoelectric conversion element 10 to be described below is merely an example, and thus a method of fabricating the photoelectric conversion element 10 (and a later-described photoelectric conversion element 30) according to an embodiment of the disclosure is not limited to examples below.

First, the semiconductor substrate 11 is formed. Specifically, a so-called SOI substrate is prepared, in which the silicon layer 110 is formed on a silicon base 1101 with a silicon oxide film 1102 being interposed therebetween. It is to be noted that a face on side of the silicon oxide film 1102 of the silicon layer 110 serves as a back face (face S1) of the semiconductor substrate 11. FIGS. 5A and 5B illustrate the structure illustrated in FIG. 1 in a vertically inverted state. Subsequently, as illustrated in FIG. 5A, the electrically-conductive plugs 120$a$1 and 120$b$1 are formed in the silicon layer 110. In this situation, it is possible to form the electrically-conductive plugs 120*a*1 and 120*b*1, for example, by forming through-vias in the silicon layer 110 and thereafter embedding, inside the through-vias, tungsten and barrier metal such as the above-described silicon nitride. Alternatively, for example, ion implantation into the silicon layer 110 may be adopted to form an electrically conductive impurity semiconductor layer. In this case, the electrically-conductive plugs 120*a*1 and 120*b*1 are formed, respectively, as an n-type semiconductor layer and a p-type semiconductor layer. Thereafter, for example, the inorganic photoelectric conversion sections 11B and 11R each having the p-type region and n-type region illustrated in FIG. 3A are formed by ion implantation in regions having different depths inside the silicon layer 110 (so as to overlap each other). Further, the electricity storage layer for green 110G is formed by ion implantation at a region adjacent to the electrically-conductive plug 120*a*1. In this manner, the semiconductor substrate 11 is formed.

Subsequently, the pixel transistor including the transfer transistors Tr1 to Tr3, and the peripheral circuit such as a logic circuit are formed on side of the face S2 of the semiconductor substrate 11. Thereafter, as illustrated in FIG. 5B, the wiring lines 51*a* of a plurality of layers are formed on the face S2 of the semiconductor substrate 11 through the interlayer insulating film 52, to thereby form the multi-layer wiring layer 51. Subsequently, the support substrate 53 including silicon is joined onto the multi-layer wiring layer 51. Thereafter, the silicon base 1101 and the silicon oxide film 1102 are peeled off from side of the face S1 of the semiconductor substrate 11 to expose the face S1 of the semiconductor substrate 11.

Next, the organic photoelectric conversion section 11G is formed on the face S1 of the semiconductor substrate 11. Specifically, as illustrated in FIG. 6A, first, the interlayer insulating film 12 configured by the stacked film of a hafnium oxide film and a silicon oxide film as described above is formed on the face S1 of the semiconductor substrate 11. For example, the hafnium oxide film is formed by an atomic layer deposition (ALD) method, and thereafter, for example, the silicon oxide film is formed by a plasma chemical vapor deposition (CVD) method. Thereafter, contact holes H1*a* and H1*b* are formed at positions facing the respective electrically-conductive plugs 120*a*1 and 120*b*1 of the interlayer insulating film 12. The electrically-conductive plugs 120*a*2 and 120*b*2 including the above-described material are so formed as to fill the contact holes H1*a* and H1*b*, respectively. In this situation, the electrically-conductive plugs 120*a*2 and 120*b*2 may be each formed to expand to a region that is desired to be light-shielded (to cover the region that is desired to be light-shielded). Alternatively, a light-shielding film may be formed at a region separated from the electrically-conductive plugs 120*a*2 and 120*b*2.

Subsequently, as illustrated in FIG. 6B, the interlayer insulating film 14 including the above-described material is formed by the plasma CVD method, for example. It is to be noted that, after the formation of the film, a surface of the interlayer insulating film 14 is desirably planarized by a chemical mechanical polishing (CMP) method, for example. Next, contact holes are opened at positions facing the electrically-conductive plugs 120*a*2 and 120*b*2 of the interlayer insulating film 14. The contact holes are filled with the above-described material to form the wiring layers 13*a* and 13*b*. It is to be noted that the CMP method, for example, may be desirably used thereafter to remove a residual wiring layer material (such as tungsten) on the interlayer insulating film 14. Next, the bottom electrode 15*a* is formed on the interlayer insulating film 14. Specifically, first, the above-described transparent electrically-conductive film is formed over the entire surface of the interlayer insulating film 14 by a sputtering method, for example. Thereafter, a photolithography method is used (exposure and development of a photoresist film, post-bake, etc. are performed), and a selective portion is removed by dry etching or wet etching, for example, thus forming the bottom electrode 15*a*. In this situation, the bottom electrode 15*a* is formed at a region that faces the wiring layer 13*a*. Further, upon the process of the transparent electrically-conductive film, the transparent electrically-conductive film is allowed to remain also at a region that faces the wiring layer 13*b*, thereby forming the wiring layer 15*b* that constitutes a portion of the transmission path of holes, together with the bottom electrode 15*a*.

Subsequently, the insulating film 16 is formed. In this situation, first, the insulating film 16 including the above-described material is formed, for example, by the plasma CVD method over the entire surface on the semiconductor substrate 11 to cover the interlayer insulating film 14, the bottom electrode 15*a*, and the wiring layer 15*b*. Thereafter, as illustrated in FIG. 7A, the formed insulating film 16 is polished, for example, by the CMP method. Thus, the bottom electrode 15*a* and the wiring layer 15*b* are exposed from the insulating film 16, and a step difference between the bottom electrode 15*a* and the insulating film 16 are moderated (desirably planarized).

Next, as illustrated in FIG. 7B, the organic photoelectric conversion layer 17 is formed on the bottom electrode 15*a*. In this situation, the above-described carrier dopant and the subphthalocyanine or the subphthalocyanine derivative are patterned to be formed by a vacuum deposition method, for example. It is to be noted that, as described above, when other organic layers (such as electron blocking film) are formed as an upper layer or a lower layer of the organic photoelectric conversion layer 17, it is desirable to form the layers successively in a vacuum process (through a vacuum consistent process). Further, the film-forming method of the organic photoelectric conversion layer 17 is not necessarily limited to the above-described vacuum deposition method; any other method, for example, a printing technique may be used.

Subsequently, as illustrated in FIG. 7C, the top electrode 18 and the protective layer 19 are formed. First, the top electrode 18 configured by the above-described transparent electrically-conductive film is formed, by the vacuum deposition method or the sputtering method, for example, over the entire surface of the substrate to cover the upper face and the side faces of the organic photoelectric conversion layer 17. It is to be noted that the top electrode 18 is desirably formed with the organic photoelectric conversion layer 17 through the vacuum consistent process, because characteristics of the organic photoelectric conversion layer 17 are easily varied under influences of moisture, oxygen, hydrogen, etc. Thereafter (before patterning of the top electrode 18), the protective layer 19 including the above-described material is formed by the plasma CVD method, for example, to cover the upper face of the top electrode 18. Subsequently, the protective layer 19 is formed on the top electrode 18, and thereafter the top electrode 18 is processed.

Thereafter, etching by means of the photolithography method is used to collectively remove a selective portion of each of the top electrode 18 and the protective layer 19. Subsequently, the contact hole H is formed on the protective layer 19, for example, by the etching by means of the photolithography method. In this situation, the contact hole H is desirably formed in a region not facing the organic photoelectric conversion layer 17. Even after the formation of the contact hole H, the photoresist is peeled off, and washing using chemical solution is performed in a manner similar to that described above. Thus, it follows that the top electrode 18 is exposed from the protective layer 19 at the region facing the contact hole H. Therefore, in consideration of generation of a pin hole as described above, the contact hole H is desirably provided by avoiding the region where the organic photoelectric conversion layer 17 is formed. Subsequently, the contact metal layer 20 containing the above-described material is formed using the sputtering method, for example. In this situation, the contact metal layer 20 is so formed on the protective layer 19 as to fill the contact hole H and to extend up to the upper face of the wiring layer 15b. Finally, the planarization layer 21 is formed over the entire surface of the semiconductor substrate 11, and thereafter the on-chip lens 22 is formed on the planarization layer 21 to complete the photoelectric conversion element 10 illustrated in FIG. 1.

As a pixel of the solid-state imaging device, the photoelectric conversion element 10 as described above, for example, obtains a signal electric charge as follows. That is, as illustrated in FIG. 8, when light L is incident through the on-chip lens 22 (not illustrated in FIG. 8) to the photoelectric conversion element 10, the light L passes through the organic photoelectric conversion section 11G and the inorganic photoelectric conversion sections 11B and 11R in order, and undergoes photoelectric conversion of each color of red, green, and blue through the passing process. FIG. 9 schematically illustrates a flow in which the signal electric charge (electron) is obtained on the basis of the incident light. Description is given below of a specific operation of signal obtainment in each of the photoelectric conversion sections.

(Obtainment of Green Signal by Organic Photoelectric Conversion Section 11G)

Green light Lg of the light L incident on the photoelectric conversion element 10 is first detected (absorbed) selectively in the organic photoelectric conversion section 11G to undergo the photoelectric conversion. Accordingly, an electron Eg of the electron-hole pair generated is extracted from side of the bottom electrode 15a, and thereafter is accumulated into the electricity storage layer for green 110G through a transmission path A (wiring layer 13a and electrically-conductive plugs 120a1 and 120a2). The accumulated electron Eg is transferred to the FD 116 upon a reading operation. It is to be noted that a hole Hg is discharged from side of the top electrode 18 through a transmission path B (contact metal layer 20, wiring layers 13b and 15b, and electrically-conductive plugs 120b1 and 120b2).

Specifically, the signal electric charge is accumulated as follows. That is, in the present embodiment, for example, a predetermined potential VL (<0 V) is applied to the bottom electrode 15a, and a potential VU (<VL) lower than the potential VL is applied to the top electrode 18. It is to be noted that the potential VL is supplied, for example, from the wiring line 51a inside the multi-layer wiring layer 51 to the bottom electrode 15a through the transmission path A. The potential VL is supplied, for example, from the wiring line 51a inside the multi-layer wiring layer 51 to the top electrode 18 through the transmission path B. Accordingly, in a state where an electric charge is accumulated (where the unillustrated reset transistor and the transfer transistor Tr1 are each in an OFF state), the electron, among the electron-hole pair generated in the organic photoelectric conversion layer 17, is guided toward side of the bottom electrode 15a having a relatively high potential (the hole is guided toward side of the top electrode 18). In this manner, the electron Eg is extracted from the bottom electrode 15a, and is accumulated in the electricity storage layer for green 110G (n-type region 115n, in detail) through the transmission path A. Further, the accumulation of the electron Eg also causes the potential VL of the bottom electrode 15a in electric conduction with the electricity storage layer for green 110G to fluctuate. This amount of the variation in the potential VL corresponds to the signal potential (here, potential of a green signal).

Further, upon the reading operation, the transfer transistor Tr1 is turned into an ON state, and the electron Eg accumulated in the electricity storage layer for green 110G is transferred to the FD116. This causes the green signal based on a light reception amount of the green light Lg to be read by the later-described vertical signal line Lsig through unillustrated another pixel transistor. Thereafter, the unillustrated reset transistor and the transfer transistor Tr1 are turned into an ON state, and the FD116 being the n-type region and an electricity storage region of the electricity storage layer for green 110G (n-type region 115n) are reset to a power supply voltage VDD, for example.

(Obtainment of Blue Signal and Red Signal by Inorganic Photoelectric Conversion Sections 11B and 11R)

Subsequently, blue light and red light of the pieces of light having been transmitted through the organic photoelectric conversion section 11G are absorbed in order, respectively, in the inorganic photoelectric conversion section 11B and the inorganic photoelectric conversion section 11R to each undergo the photoelectric conversion. In the inorganic photoelectric conversion section 11B, an electron Eb corresponding to incident blue light is accumulated in the n-type region (n-type photoelectric conversion layer 111n), and the accumulated electron Ed is transferred to the FD 113 upon the reading operation. It is to be noted that the hole is accumulated in the unillustrated p-type region. Likewise, in the inorganic photoelectric conversion section 11R, an electron Er corresponding to the incident red light is accumulated in the n-type region (n-type photoelectric conversion layer 112n), and the accumulated electron Er is transferred to the FD 114 upon the reading operation. It is to be noted that the hole is accumulated in the unillustrated p-type region.

As described above, in the state where the electric charge is accumulated, the negative potential VL is applied to the bottom electrode 15a of the organic photoelectric conversion section 11G. Thus, the p-type region (p-type region 111p in FIG. 2) being the hole accumulation layer of the inorganic photoelectric conversion section 11B tends to have an increased hole concentration. Accordingly, it becomes possible to suppress occurrence of a dark current at the interface between the p-type region 111p and the interlayer insulating film 12.

Upon the reading operation, similarly to the above-described organic photoelectric conversion section 11G, the transfer transistors Tr2 and Tr3 are turned into an ON state, and the electrons Eb and Er accumulated, respectively, in the n-type photoelectric conversion layers 111n and 112n are transferred, respectively, to the FD113 and FD114. This causes each of the blue signal based on a light reception amount of the blue light Lb and the red signal based on a light reception amount of the red light Lr to be read by the later-described vertical signal line Lsig through unillustrated another pixel transistor. Thereafter, the unillustrated reset transistor and the transfer transistors Tr2 and Tr3 are turned into an ON state, and the FD113 and FD114 being the n-type region are reset to the power supply voltage VDD, for example.

In this manner, by stacking the organic photoelectric conversion section 11G and the inorganic photoelectric conversion sections 11B and 11R in the vertical direction, it becomes possible to detect pieces of color light of red, green, and blue separately without providing a color filter, thus allowing a signal electric charge of each color to be obtained. This makes it possible to suppress optical loss (reduction in sensitivity) caused by color light absorption by the color filter as well as occurrence of a false color associated with a pixel interpolation process.

(1-3. Workings and Effects)

It is necessary for a photoelectric conversion element (imaging element) used for an imaging device such as a CCD image sensor or a CMOS image sensor to have superior wavelength selectivity and high photoresponse. a subphthalocyanine derivative is typically used widely as an organic semiconductor serving to absorb green light. However, the subphthalocyanine derivative is low in carrier mobility, which has caused an issue in which it is not possible to obtain sufficient photoresponse in a case of using as an imaging device. Therefore, a technology has been desired which improves conductivity characteristics while maintaining superior wavelength selectivity of the subphthalocyanine derivative.

Examples of a method of improving conductivity characteristics of a carrier include a method of doping a target layer with a carrier. However, as described above, in the case where the photoelectric conversion layer using the subphthalocyanine derivative is simply doped with a dopant by several percents, it is found that the conductivity characteristics of the carrier tend not to be sufficiently improved. Further, in some cases, light-absorption characteristics may be lowered.

In contrast, the subphthalocyanine or the subphthalocyanine derivative and a carrier dopant having a concentration less than 1% by volume ratio to the subphthalocyanine or the subphthalocyanine derivative are used to form the photoelectric conversion layer 17 in the present embodiment. This allows mobility of the carrier of the organic photoelectric conversion layer 17 to be improved.

Thus, in the photoelectric conversion element 10 according to the present embodiment, the photoelectric conversion layer 17 is formed using the subphthalocyanine or the subphthalocyanine derivative and the carrier dopant having a concentration less than 1% (by volume ratio) to the subphthalocyanine or the subphthalocyanine derivative. This allows mobility of the carrier of the organic photoelectric conversion layer 17 to be improved. Accordingly, it is possible to improve photoresponse while maintaining superior wavelength selectivity of the subphthalocyanine or the subphthalocyanine derivative. In other words, it is possible to provide an imaging device and an electronic apparatus (imaging unit) having superior spectroscopic characteristics and high photoresponse.

2. Modification Example

FIG. 10 illustrates a cross-sectional configuration of a photoelectric conversion element 30 according to a modification example of the disclosure. Similarly to the photoelectric conversion element 10 of the above-described embodiment, the photoelectric conversion element 30 constitutes a single pixel in, for example, an imaging device such as a CCD image sensor or a CMOS image sensor.

The photoelectric conversion element 30 of the modification example includes a red photoelectric conversion section 40R, a green photoelectric conversion section 40G, and a blue photoelectric conversion section 40B in order on a silicon substrate 61, with an insulating layer 62 being interposed therebetween. An on-chip lens 32 is provided on the blue-color photoelectric conversion section 40B, with a protective layer 33 and a planarization layer 31 being interposed therebetween. A electricity storage layer for red 310R, a electricity storage layer for green 310G, and a electricity storage layer for blue 310B are provided in the silicon substrate 61. Light that enters the on-chip lens 32 undergoes photoelectric conversion at the red photoelectric conversion section 40R, the green photoelectric conversion section 40G, and the blue photoelectric conversion section 40B, and respective signal electric charges are transmitted from the red photoelectric conversion section 40R to the electricity storage layer for red 310R, from the green photoelectric conversion section 40G to the electricity storage layer for green 310G, and from the blue photoelectric conversion section 40B to the electricity storage layer for blue 310B. The signal electric charge may be either an electron or a hole that is generated from the photoelectric conversion.

The silicon substrate 61 includes, for example, a p-type silicon substrate. The electricity storage layer for red 310R, the electricity storage layer for green 310G, and the electricity storage layer for blue 310B provided in this silicon substrate 61 each include a corresponding n-type semiconductor region. Signal electric charges supplied from the red photoelectric conversion section 40R, the green photoelectric conversion section 40G, and the blue photoelectric conversion section 40B are accumulated in the respective n-type semiconductor regions. The respective n-type semiconductor regions of the electricity storage layer for red 310R, the electricity storage layer for green 310G, and the electricity storage layer for blue 310B are formed by doping the silicon substrate 61 with an n-type impurity such as phosphorus (P) or arsenic (As). It is to be noted that the silicon substrate 61 may be provided on a support substrate (not illustrated) containing glass, for example.

The insulating layer 62 includes, for example, silicon oxide ($SiO_2$), silicon nitride (SiN), silicon oxynitride (SiON), and hafnium oxide ($HfO_2$). The insulating layer 62 may be so formed as to have a plurality of types of insulating films stacked. The insulating layer 62 may also be configured by an organic insulating material. A plug and an electrode (neither unillustrated) are provided in this insulating layer 62. The plug and the electrode couple the electricity storage layer for red 310R with the red photoelectric conversion section 40R, the electricity storage layer for green 310G with the green photoelectric conversion section 40G, and the electricity storage layer for blue 310B with the blue photoelectric conversion section 40B.

The red photoelectric conversion section 40R includes a first electrode 41R, a photoelectric conversion layer 42R, and a second electrode 43R in this order from a position close to the silicon substrate 61. The green photoelectric conversion section 40G includes a first electrode 41G, a photoelectric conversion layer 42G, and a second electrode 43G in order from a location close to the red photoelectric conversion section 40R. The blue photoelectric conversion section 40B includes a first electrode 41B, a photoelectric conversion layer 42B, and a second electrode 43B in order from a location close to the green photoelectric conversion section 40G. An insulating layer 44 is provided between the red photoelectric conversion section 40R and the green photoelectric conversion section 40G, and an insulating layer 45 is provided between the green photoelectric conversion section 40G and the blue photoelectric conversion section 40B. Red color light (for example, wavelength of 600 nm to 800 nm), green color light (for example, wavelength of 450 nm to 650 nm), and blue color light (for example, wavelength of 400 nm to 600 nm) are respectively absorbed selectively by the red photoelectric conversion section 40R, the green photoelectric conversion section 40G, and the blue photoelectric conversion section 40B, to thereby each generate an electron-hole pair.

The first electrode 41R, the first electrode 41G, and the first electrode 41B respectively extract the signal electric charges (electric charges) generated in the photoelectric conversion layer 42R, the photoelectric conversion layer 42G, and the photoelectric conversion 42B. The first electrodes 41R, 41G, and 41B are, for example, provided on a pixel-by-pixel basis. The first electrodes 41R, 41G, and 41B are each configured by, for example, an electrically-conductive material having light-transmissivity, and specifically, ITO (Indium-Tin-Oxide). The first electrodes 41R, 41G, and 41B may be each configured by a tin oxide ($SnO_2$)-based material or a zinc oxide (ZnO)-based material, for example. Examples of the tin oxide-based material include a material in which a tin oxide is doped with a dopant. Examples of the zinc oxide-based material include aluminum zinc oxide (AZO) in which a zinc oxide is doped with aluminum (Al) as a dopant, gallium zinc oxide (GZO) in which a zinc oxide is doped with gallium (Ga) as a dopant, and indium zinc oxide (IZO) in which a zinc oxide is doped with indium (In) as a dopant. Aside from those described above, for example, IGZO, CuI, $InSbO_4$, ZnMgO, $CuInO_2$, $MgIn_2O_4$, CdO, and $ZnSnO_3$ may be used. The first electrodes 41R, 41G, and 41B each have a thickness (thickness in a stacked direction, hereinafter, simply referred to as thickness) of 50 nm to 500 nm, for example.

The photoelectric conversion layers 42R, 42G, and 42B each absorb light of a selective wavelength region and subject the light to photoelectric conversion, and transmit light of another wavelength region. The photoelectric conversion layers 42R, 42G, and 42B include respective organic dyes that absorb pieces of light of selective wavelength regions each corresponding to the photoelectric conversion sections 40R, 40G, and 40B. The photoelectric conversion layers 42R, 42G, and 42B each have a thickness of 0.05 μm to 10 μm, for example. The photoelectric conversion layers 42R, 42G, and 42B include a similar configuration to each other excluding the wavelength regions of absorbed light differing from each other.

Examples of the organic dyes include the subphthalocyanine or the subphthalocyanine derivative represented by the above formula (5) or (6) and the quinacridone or the quinacridone derivative represented by the above formulae (7-1) and (7-2). Aside from those, examples of an organic dye that absorbs blue color include a coumarin derivative, a silole derivative and a fluorine, examples of an organic dye that absorbs green light include a dipyrrin derivative, a squalene derivative, and a perylene derivative, and examples of an organic dye that absorbs red color include zinc phtalocyanine.

In the modification example, a layer, which is formed with use of the subphthalocyanine or the subphthalocyanine derivative as an organic dye, among the photoelectric conversion layers 42R, 42G, and 42B, is so formed as to include a carrier dopant as well as the subphthalocyanine or the subphthalocyanine derivative. In this situation, the doping amount of the carrier dopant preferably has a concentration less than 1% by volume ratio to the subphthalocyanine or the subphthalocyanine derivative. This allows mobility of the carrier of the photoelectric conversion layer 42G (or the photoelectric conversion layers 42R and 42B) using the subphthalocyanine or the subphthalocyanine derivative to be improved.

The second electrodes 43R, 43G, and 43B respectively extract holes generated by the photoelectric conversion layers 42R, 42G, and 42G. The holes extracted from the respective second electrodes 43R, 43G, and 43B are discharged into a p-type semiconductor region (unillustrated) in the silicon substrate 61, for example, via each transmission path (unillustrated). The second electrodes 43R, 43G, and 43B are each configured by a electrically conductive material such as gold (Au), silver (Ag), Copper (Cu), and aluminum (Al), for example. Similarly to the first electrodes 41R, 41G, and 41B, the second electrodes 43R, 43G, and 43B may be configured by a transparent electrically conductive material. In the photoelectric conversion element 30, the holes extracted from the second electrodes 43R, 43G, and 43B are discharged. Therefore, in a case where a plurality of photoelectric conversion elements 30 are provided (for example, a later-described imaging device 1 of FIG. 11), the second electrodes 43R, 43G, and 43B may be provided commonly to each of the photoelectric conversion elements 30 (unit pixel P in FIG. 11). The second electrodes 43R, 43G, and 43B each have a thickness of 0.5 nm to 100 nm, for example.

The insulating layer 44 insulates the second electrode 43R and the first electrode 41G. The insulating layer 45 insulates the second electrode 43G and the first electrode 41B. The insulating layers 44 and 25 include a metal oxide, a metal sulfide, or an organic substance, for example. Examples of the metal oxide include silicon oxide ($SiO_2$), aluminum oxide ($Al_2O_3$), zirconium oxide ($ZrO_2$), titanium oxide ($TiO_2$), zinc oxide (ZnO), tungsten oxide ($WO_3$), magnesium oxide (MgO), oxidization niobium ($Nb_2O_3$), tin oxide ($SnO_2$), and oxidization gallium ($Ga_2O_3$). Examples of the metal sulfide include zinc sulfide (ZnS) and magnesium sulfide (MgS). A material configuring the insulating layers 44 and 25 preferably has a bandgap of no less than 3.0 eV. The insulating layers 44 and 25 each have a thickness of 2 nm to 100 nm, for example.

The protective layer 33 that covers the second electrode 43B prevents water or other substance from entering the red photoelectric conversion section 40R, the green photoelectric conversion section 40G, and the blue photoelectric conversion section 40B. The protective layer 33 includes a material having light-transmissivity. A monolayer film containing silicon nitride, silicon oxide, or silicon oxynitride, for example, or stacked layers containing them is used for the protective layer 33.

The on-chip lens 32 is provided on the protective layer 33 with the planarization layer 31 being interposed therebetween. An acrylic resin material, a styrenic resin material, an epoxy resin material, or other material may be used for the planarization layer 31. The planarization layer 31 may be provided as necessary, and the protective layer 33 may serve as the planarization layer 31. The on-chip lens 32 condenses light incident from above to each light-receiving face of the red photoelectric conversion section 40R, the green photoelectric conversion section 40G, and the blue photoelectric conversion section 40B.

Any other unillustrated layer may be provided between the first electrode 41R and the photoelectric conversion layer 42R, between the first electrode 41G and the photoelectric conversion layer 42G, between the first electrode 41B and the photoelectric conversion layer 42B, or between the photoelectric conversion layer 42R and the second electrode 43R, between the photoelectric conversion layer 42G and the second electrode 43G, and the photoelectric conversion layer 42B and the second electrode 43B.

An electron transport layer may be provided, for example, between the first electrode 41R and the photoelectric conversion layer 42R, between the first electrode 41G and the photoelectric conversion layer 42G, and between the first electrode 41B and the photoelectric conversion layer 42B. The electron transport layer promotes supplying electrons generated in the photoelectric conversion layers 42R, 42G, and 42B, respectively to the first electrodes 41R, 41G, and 41B. The electron transport layer is configured by, for example, titanium oxide ($TiO_2$) or zinc oxide (ZnO). Further, the electron transport layer may be so formed to stack titanium oxide and zinc oxide. The electron transport layer has a thickness of 0.1 nm to 1000 nm, for example, and preferably has a thickness of 0.5 nm to 200 nm.

A hole transport layer may be provided, for example, between the photoelectric conversion layer 42R and the second electrode 43R, between the photoelectric conversion layer 42G and the second electrode 43G, and between the photoelectric conversion layer 42B and the second electrode 43B. The hole transport layer promotes supplying holes generated in the photoelectric conversion layers 42R, 42G, and 42B, respectively to the second electrodes 43R, 23G, and 23B. The hole transport layer is configured by, for example, molybdenum oxide ($MoO_3$), nickel oxide (NiO), or vanadium oxide ($V_2O_5$). Further, the hole transport layer may be configured by an organic material such as PEDOT (Poly(3,4-ethylenedioxythiophene)) and TPD (N,N'-Bis(3-methylphenyl)-N,N'-diphenylbenzidine). The hole transport layer has a thickness of 0.5 nm to 100 nm, for example.

As described above, in the modification example, the photoelectric conversion layer (for example, the photoelectric conversion layer 42G) containing the subphthalocyanine or the subphthalocyanine derivative is doped with the carrier dopant having a concentration less than 1% (by volume ratio) to the subphthalocyanine or the subphthalocyanine derivative. This allows mobility of the carrier in the photoelectric conversion layer 42G to be improved as in the above-described embodiment, making it possible to improve photoresponse while maintaining superior wavelength selectivity of the subphthalocyanine or the subphthalocyanine derivative. In this manner, doping with an appropriate amount of the carrier dopant the photoelectric conversion layer containing the subphthalocyanine or the subphthalocyanine derivative achieves exerting the effect of allowing mobility of the carrier of the photoelectric conversion layer to be improved regardless of the configuration of the photoelectric conversion element.

3. Application Examples

Application Example 1

FIG. 11 illustrates an overall configuration of the imaging device (imaging device 1) that uses, as each pixel, the photoelectric conversion element 10 (or the photoelectric conversion element 30) described in the above-described embodiment. The imaging device 1 is a CMOS imaging sensor. The imaging device 1 has a pixel section 1a as an imaging area on the semiconductor substrate 11. Further, the imaging device 1 includes, for example, a peripheral circuit section 130 including a row scanning section 131, a horizontal selection section 133, a column scanning section 134, and a system controller 132 in a peripheral region of the pixel section 1a.

The pixel section 1a includes, for example, a plurality of unit pixels P (equivalent to the photoelectric conversion elements 10) that are two-dimensionally arranged in rows and columns. To the unit pixels P, for example, pixel drive lines Lread (specifically, row selection lines and reset control lines) are wired on a pixel-row basis, and vertical signal lines Lsig are wired on a pixel-column basis. The pixel drive line Lread transmits a drive signal for reading of a signal from the pixel. One end of the pixel drive line Lread is coupled to an output terminal corresponding to each row of the row scanning section 131.

The row scanning section 131 is configured by a shift register, an address decoder, etc. The row scanning section 131 is, for example, a pixel drive section that drives the respective unit pixels P in the pixel section 1a on a row-unit basis. Signals outputted from the respective unit pixels P in the pixel row selectively scanned by the row scanning section 131 are supplied to the horizontal selection section 133 via the respective vertical signal lines Lsig. The horizontal selection section 133 is configured by an amplifier, a horizontal selection switch, etc., that are provided for each vertical signal line Lsig.

The column scanning section 134 is configured by a shift register, an address decoder, etc. The column scanning section 134 sequentially drives the respective horizontal selection switches in the horizontal selection section 133 while scanning the respective horizontal selection switches in the horizontal selection section 133. The selective scanning by the column scanning section 134 causes signals of the respective pixels that are transmitted via the respective vertical signal lines Lsig to be sequentially outputted to horizontal signal lines 135, and to be transmitted to the outside of the semiconductor substrate 11 through the horizontal signal lines 135.

A circuit part including the row scanning section 131, the horizontal selection section 133, the column scanning section 134, and the horizontal signal lines 135 may be formed directly on the semiconductor substrate 11, or may be provided in an external control IC. Alternatively, the circuit part may be formed on another substrate coupled with use of a cable, etc.

The system controller 132 receives a clock, data instructing an operation mode, etc., that are supplied from the outside of the semiconductor substrate 11. The system controller 132 also outputs data such as internal information of the imaging device 1. The system controller 132 further includes a timing generator that generates various timing signals, and performs drive control of peripheral circuits such as the row scanning section 131, the horizontal selection section 133, and the column scanning section 134 on the basis of the various timing signals generated by the timing generator.

Application Example 2

The above-described imaging device 1 is applicable to any type of electronic apparatus (imaging unit) having an imaging function, for example, a camera system such as a digital still camera and a video camera, and a mobile phone having the imaging function. FIG. 12 illustrates an outline configuration of an electronic apparatus 2 (camera) as an example thereof. This electronic apparatus 2 may be, for example, a video camera that is able to photograph a still image or a moving image. The electronic apparatus 2 includes, for example, the imaging device 1, an optical system (optical lens) 310, a shutter unit 311, a drive section 313 that drives the imaging device 1 and the shutter unit 311, and a signal processing section 312.

The optical system 310 guides image light (incident light) obtained from a subject to the pixel section 1a in the imaging device 1. The optical system 310 may be configured by a plurality of optical lenses. The shutter device 311 controls a period in which the imaging device 1 is irradiated with light and a period in which the light is blocked with respect to the imaging device 1. The drive section 313 controls a transfer operation of the imaging device 1 and a shutter operation of the shutter device 311. The signal processing section 312 performs various signal processes on a signal outputted from the imaging device 1. An image signal Dout after the signal process is stored in a storage medium such as memory, or outputted to a monitor, for example.

4. Examples

In the following, various types of samples relating to the embodiments and the modification example according to the disclosure were fabricated to evaluate photoresponse, I-V characteristics, and absorption spectrum.

Experiment 1

First, in experiment example 1-1, an ITO electrode serving as a bottom electrode was provided on a quartz substrate by means of sputtering, following which a film of a photoelectric conversion layer is formed. Specifically, butylquinacridone (BQD) represented by the above-described formula (7-2), subphthalocyanine fluoride ($F_6$-SubPc-Cl) represented by the formula (5-2), and leuco crystal violet (LCV) represented by the formula (1-1), for example, were so subjected to co-deposition with the volume ratio of 1:1:0.001, as to form a film of an organic photoelectric conversion layer having a thickness of 100 nm. Here, BQD serves as hole transport, while $F_6$-SubPc-Cl serves as electron transport. Subsequently, a film of AlSiCu having a thickness of 100 nm was formed on the organic photoelectric conversion layer by means of an evaporation method to fabricate a photoelectric conversion element having this film serving as a top electrode.

Aside from those described above, in experiment examples 1-2 to 1-4, the photoelectric conversion elements each having an organic photoelectric conversion layer containing BQD, $F_6$-SubPc-Cl, and LCV, respectively with the volume ratios of 1:1:0.005 (experiment example 1-2), 1:1:0.01 (experiment example 1-3), and 1:1:0.05 (experiment example 1-4) were fabricated. Further, a photoelectric conversion element was fabricated using a method similar to those of experiment examples 1-1 to 1-4 excluding use of 1,3-dimethyl-2-phenyl-2,3-dihydro-1H-benzoimidazole (DMBI) represented by the above-described formula (4-1) in place of LCV of experiment examples 2-1 to 2-4. Furthermore, as a comparative example, a photoelectric conversion element having an organic photoelectric conversion layer containing BQD and $F_6$-SubPc-Cl (1:1 by volume ratio) was fabricated without using a carrier dopant. These experiment examples 1-1 to 1-4 and 2-1 to 2-4 and the comparative example were evaluated in terms of photoresponse as follows. Table 1 collectively shows types of carrier dopants used for the comparative example and the experiment examples 1-1 to 1-4 and 2-1 to 2-4, concentrations (%) of the carrier dopants to the subphthalocyanine derivative, presence/absence of effect, and photoresponse time (a.u.).

Photoresponse was evaluated by measuring, using an oscilloscope, the speed of a light current value observed during light irradiation falling down after stopping the light irradiation. Specifically, the amount of light (green light) with which a photoelectric conversion element is irradiated from a light source via a filter was set to 1.62 µW/cm², and the bias voltage applied between electrodes was set to −1 V (0 V to a top electrode, and −1 V to a bottom electrode). A steady current thereof was observed in this state, following which the light irradiation was stopped to observe how the current was attenuated. Subsequently, a dark current value was subtracted from an obtained current-time curve. Using the current-time curve thus obtained, the time necessary for the current value after stopping the light irradiation to having been attenuated down to 3% of the current value that was observed in the steady state was set as an index of photoresponse.

TABLE 1

| | Dopant | Concentration (%) | Presence/absence of effect | Photoresponse time (a.u.) |
|---|---|---|---|---|
| Comparative example | — | 0 | — | 1.0 |
| Example 1-1 | Formula (1-1) | 0.1 | o | 0.26 |
| Example 1-2 | Formula (1-1) | 0.5 | o | 0.25 |
| Example 1-3 | Formula (1-1) | 1 | x | 1.0 |
| Example 1-4 | Formula (1-1) | 5 | x | 1.2 |
| Example 2-1 | Formula (4-1) | 0.02 | o | 0.46 |
| Example 2-2 | Formula (4-1) | 0.1 | o | 0.51 |
| Example 2-3 | Formula (4-1) | 1 | x | 2.3 |
| Example 2-4 | Formula (4-1) | 5 | x | 3.6 |

FIGS. 13 and 14 respectively illustrate the experiment examples 1-1 to 1-4 and the experiment examples 2-1 to 2-4, and illustrate a transition response during which the top electrode was applied with 0 V, the bottom electrode was applied with −1 V, and the green light of 1.62 µW/cm² with which a photoelectric conversion element has been irradiated was switched to an unirradiated state at the timing of t=0. As seen from FIGS. 13 and 14, when the carrier dopant concentration was less than 1%, the photoresponse was improved as compared to that of the comparative example. Specifically, the photoresponse was improved approximately four times in the experiment examples 1-1 and 1-2 using LCV as a carrier dopant. Further, the photoresponse was improved approximately double in the experiment examples 2-1 and 2-2 using DMBI as a carrier dopant.

Experiment 2

Further, photoelectric conversion elements (experiment examples 3-1 to 3-3) were fabricated in which LCV, acridine orange (AOB) represented by the formula (2-1), and DMBI are used for the respective photoelectric conversion layers as carrier dopants, and each of voltage-current characteristics (I-V characteristics) thereof was measured. The configurations of elements in each of experiment examples 3-1 to 3-3 are as follows.

In the experiment example 3-1, an ITO film as a bottom electrode was provided on a quartz substrate, following which a film of an organic photoelectric conversion layer having a thickness of 100 nm with the volume ratio of $F_6$-SubPc-Cl to LCV being 1:0.01 was formed on the ITO film. Thereafter, a lithium fluoride (LiF) film having a thickness of 0.5 nm was formed. Finally, an AlSiCu film was formed as a top electrode on the LiF film to thereby fabricate a photoelectric conversion element (experiment example 3-1).

In the experiment example 3-2, an AlSiCu film was formed as a bottom electrode on a quartz substrate, and thereafter, a lithium fluoride (LiF) film having a thickness of 0.5 nm was formed on the AlSiCu film. Subsequently, an organic photoelectric conversion layer having a thickness of 100 nm with the volume ratio of $F_6$-SubPc-Cl to AOB being 1:0.01 was formed on the LiF film, and thereafter, a lithium fluoride (LiF) film having a thickness of 0.5 nm was formed. Finally, an AlSiCu film was formed as a top electrode on the Lif film to thereby fabricate a photoelectric conversion element (experiment example 3-1). In the experiment example 3-3, a photoelectric conversion element including a similar configuration to that of the experiment example 3-2 excluding use of DMBI as a carrier dopant was fabricated.

Further, in the comparative examples 3-1 to 3-3 with respect to the experiment examples 3-1 to 3-3, photoelectric conversion elements each including a similar configuration to those of experiment examples 3-1 to 3-3 were fabricated, except that each of them not containing a carrier dopant.

FIGS. 15 to 17 respectively illustrate the I-V characteristics of the experiment example 3-1 and the comparative example 3-1, the experiment example 3-2 and the comparative example 3-2, and the experiment example 3-3 and the comparative example 3-3. It is found from FIGS. 15 to 17 that the doping with the carrier dopant the organic photoelectric conversion layer containing $F_6$-SubPc-Cl allows the carrier dopant to act on $F_6$-SubPc-Cl, to thereby improve the conductivity of the carrier (here, electron). The resulting improvement of the conductivity owing to the doping with the carrier dopant was also confirmed in view of the rise of the Fermi level shown in Table 2, for example. Specifically, the Fermi level was evaluated by an ultraviolet photoelectron spectroscopy, a result of which the Fermi level (eV) rose by 0.2 eV in the experiment example 3-1 with a carrier dopant being doped, as compared to the comparative example 3-1 without a carrier dopant.

TABLE 2

|  | Dopant | Presence/absence of effect | Fermi level (eV) |
|---|---|---|---|
| Comparative example 3-1 | — | — | −4.5 |
| Example 3-1 | Formula (1-1) | ○ | −4.3 |

FIG. 18 illustrates an absorption spectrum of the photoelectric conversion elements in the experiment example 3-1 and the comparative example 3-1. It is found from FIG. 18 that doping with the carrier dopant does not influence wavelength selectivity of $F_6$-SubPc-Cl.

Further, doping with the carrier dopant the organic photoelectric conversion layer containing $F_6$-SubPc-Cl allows the conductivity of the carrier to be improved, which makes it possible to reduce drive voltage.

Description has been given hereinabove referring to the embodiment and the modification example; however, content of the disclosure is not limited to the foregoing embodiment and the like, and various modifications may be made. For example, the numbers of organic and inorganic photoelectric conversion sections, and the ratio therebetween are not limitative as well. Two or more organic photoelectric conversion sections may be provided, or color signals of a plurality of colors may be obtained only by the organic photoelectric conversion sections. Furthermore, the organic photoelectric conversion section and the inorganic photoelectric conversion section are not limited to have a vertically-stacked structure, and may be arranged side by side along the substrate surface.

Moreover, the foregoing embodiment and the modification example exemplify the configuration of the backside illumination type imaging unit; however, the content of the disclosure is also applicable to an imaging unit of a front side illumination type. Further, the imaging device (photoelectric conversion element) of the disclosure does not necessarily include all of the components described in the foregoing embodiment, and may include any other layer, conversely.

It is to be noted that the effects described herein are merely examples and are not necessarily limitative; the effects may further include other effects.

It is to be noted that the present disclosure may have the following configurations.

[1]

A photoelectric conversion element including:

a first electrode and a second electrode that are disposed to face each other; and a photoelectric conversion layer that is provided between the first electrode and the second electrode, and contains at least a subphthalocyanine or a subphthalocyanine derivative, and a carrier dopant, in which the carrier dopant has a concentration of less than 1% by volume ratio to the subphthalocyanine or the subphthalocyanine derivative.

[2]

The photoelectric conversion element according to [1], in which the carrier dopant includes an organic material.

[3]

The photoelectric conversion element according to [1] or [2], in which, upon doping, the carrier dopant is accompanied with chemical reaction.

[4]

The photoelectric conversion element according to [1] or [2], in which, upon doping, the carrier dopant is accompanied with elimination reaction or addition reaction of hydrogen, carbon oxide, nitrogen, or hydroxyl radical.

[5]

The photoelectric conversion element according to any one of [1] to [4], in which the carrier dopant includes an electron dopant.

[6]

The photoelectric conversion element according any one of [1] to [5], in which the carrier dopant is one or more of triphenylmethane derivative represented by a following formula (1), acridine derivative represented by a following formula (2), xanthenes derivative represented by a following formula (3), and benzimidazole derivative represented by a following formula (4):

[Chem. 1]

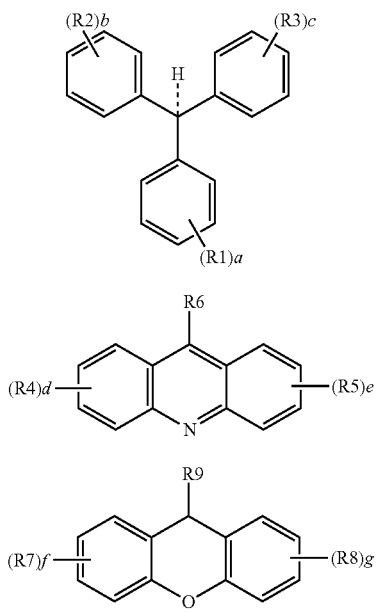

(1)

(2)

(3)

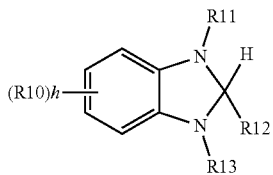

(4)

where R1 to R13 denote, each independently: hydrogen atom; halogen atom; a linear chain, branched, or cyclic alkyl group; thioalkyl group; thioaryl group; arylsulfonyl group; alkylsulfonyl group; amino group; alkylamino group; arylamino group; hydroxy group; alkoxy group; acylamino group; acyloxy group; phenyl group; carboxy group; carboxoamide group; carboalkoxy group; acyl group; sulfonyl group; cyano group; and nitro group; or a derivative thereof. Further, R1 to R13 may form a cycle by bonding with each other. a to h are each an integer of 0 or more.

[7]

The photoelectric conversion element according to any one of [1] to [6], in which the subphthalocyanine derivative is one or more of compounds represented by following formulae (5) and (6):

[Chem. 2]

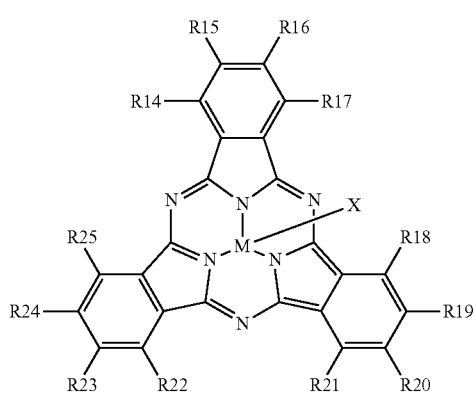

(5)

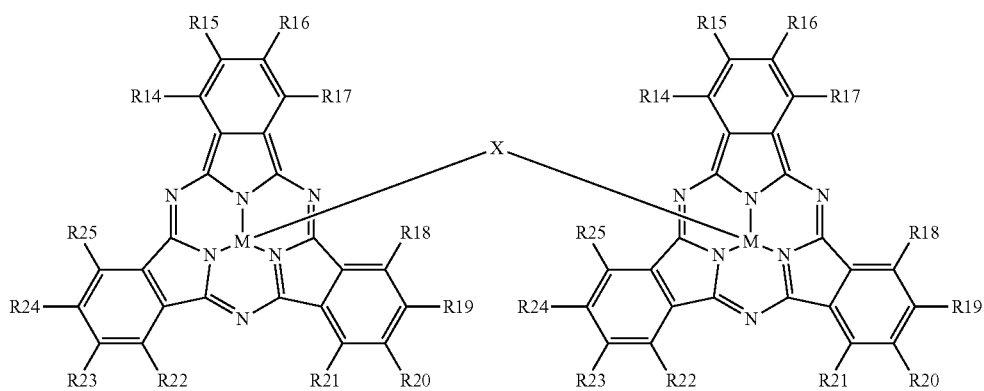

(6)

where R14 to R25 and X denote, each independently: hydrogen atom; halogen atom; a linear chain, branched, or cyclic alkyl group; thioalkyl group; thioaryl group; arylsulfonyl group; alkylsulfonyl group; amino group; alkylamino group; arylamino group; hydroxy group; alkoxy group; acylamino group; acyloxy group; phenyl group; carboxy group; carboxoamide group; carboalkoxy group; acyl group; sulfonyl group; cyano group; nitro group; heterocyclic group; or a derivative thereof. Any mutually adjacent R14 to R25 may form a cycle by bonding with each other. M denotes boron, or a divalent or trivalent metal.

[8]
The photoelectric conversion element according to any one of [1] to [7], in which the photoelectric conversion layer includes a p-type semiconductor.

[9]
The photoelectric conversion element according to [8], in which the p-type semiconductor includes a quinacridone derivative.

[10]
The photoelectric conversion element according to [8] or [9], in which the photoelectric conversion layer further includes an n-type semiconductor.

[11]
The photoelectric conversion element according to [10], in which the n-type semiconductor includes a fullerene derivative.

[12]
An imaging device in which pixels each include one or a plurality of organic photoelectric conversion sections, the organic photoelectric conversion sections each including:
a first electrode and a second electrode that are disposed to face each other; and
a photoelectric conversion layer that is provided between the first electrode and the second electrode, and contains at least a subphthalocyanine or a subphthalocyanine derivative, and a carrier dopant,
in which the carrier dopant has a concentration of less than 1% by volume ratio to the subphthalocyanine or the subphthalocyanine derivative.

[13]
The imaging device according to [12], in which, in each of the pixels, the one or the plurality of organic photoelectric conversion sections and one or a plurality of inorganic photoelectric conversion sections are stacked, the one or the plurality of inorganic photoelectric conversion sections performing photoelectric conversion of a wavelength region different from that of the organic photoelectric conversion section.

[14]
The imaging device according to [13], in which
the inorganic photoelectric conversion section is embedded in a semiconductor substrate, and
the organic photoelectric conversion section is provided on first face side of the semiconductor substrate.

[15]
The imaging device according to [14], in which
the organic photoelectric conversion section performs the photoelectric conversion of green light, and
the inorganic photoelectric conversion section that performs the photoelectric conversion of blue light and the inorganic photoelectric conversion section that performs the photoelectric conversion of red light are stacked in the semiconductor substrate.

[16]
An electronic apparatus with an imaging device, in which pixels each have one or a plurality of organic photoelectric conversion sections, the organic photoelectric conversion sections each including:
a first electrode and a second electrode that are disposed to face each other; and
a photoelectric conversion layer that is provided between the first electrode and the second electrode, and contains at least a subphthalocyanine or a subphthalocyanine derivative, and a carrier dopant,
in which the carrier dopant has a concentration of less than 1% by volume ratio to the subphthalocyanine or the subphthalocyanine derivative.

This application is based upon and claims priority from Japanese Patent Application Nos. 2016-004383 filed with the Japan Patent Office on Jan. 13, 2016 and 2016-062422 filed with the Japan Patent Office on Mar. 25, 2016, the entire contents of which are hereby incorporated by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A photoelectric conversion element, comprising:
a first electrode;
a second electrode that faces the first electrode, wherein the first electrode and the second electrode are electrically coupled to at least one electrically-conductive plug; and
a photoelectric conversion layer between the first electrode and the second electrode, wherein
the photoelectric conversion layer comprises at least a subphthalocyanine or a subphthalocyanine derivative, and a carrier dopant, and
the carrier dopant has a concentration of less than 1% by volume ratio to the subphthalocyanine or the subphthalocyanine derivative.

2. The photoelectric conversion element according to claim 1, wherein the carrier dopant comprises an organic material.

3. The photoelectric conversion element according to claim 1, wherein, upon doping, the carrier dopant is accompanied with chemical reaction.

4. The photoelectric conversion element according to claim 1, wherein, upon doping, the carrier dopant is accompanied with one of elimination reaction or addition reaction of at least one of hydrogen, carbon oxide, nitrogen, or hydroxyl radical.

5. The photoelectric conversion element according to claim 1, wherein the carrier dopant comprises an electron dopant.

6. The photoelectric conversion element according to claim 1, wherein the carrier dopant is at least one of triphenylmethane derivative represented by a following formula (1), acridine derivative represented by a following formula (2), xanthenes derivative represented by a following formula (3), and benzimidazole derivative represented by a following formula (4):

[Chem. 1]

(1)

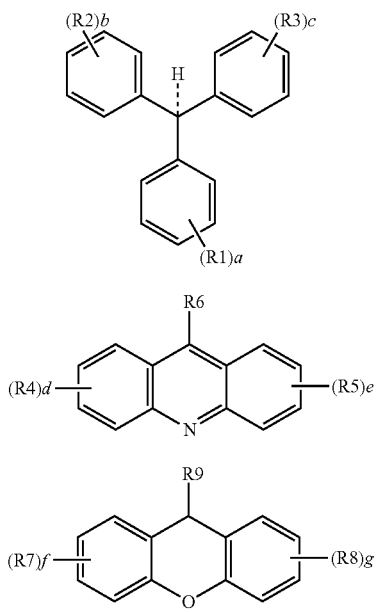

(2)

(3)

(4)

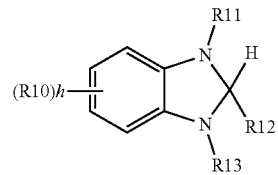

where R1 to R13 denote, each independently: hydrogen atom; halogen atom; a linear chain, branched, or cyclic alkyl group; thioalkyl group; thioaryl group; arylsulfonyl group; alkylsulfonyl group; amino group; alkylamino group; arylamino group; hydroxy group; alkoxy group; acylamino group; acyloxy group; phenyl group; carboxy group; carboxoamide group; carboalkoxy group; acyl group; sulfonyl group; cyano group; and nitro group; or a derivative, wherein R1 to R13 form a cycle by bonding with each other, and a to h are each an integer of 0 or more.

7. The photoelectric conversion element according to claim 1, wherein the subphthalocyanine derivative is at least one of compounds represented by following formulae (5) and (6):

[Chem. 2]

(5)

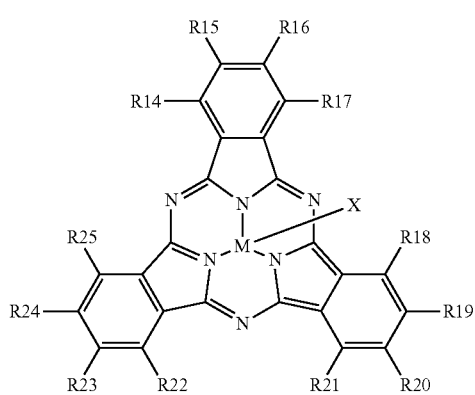

(6)

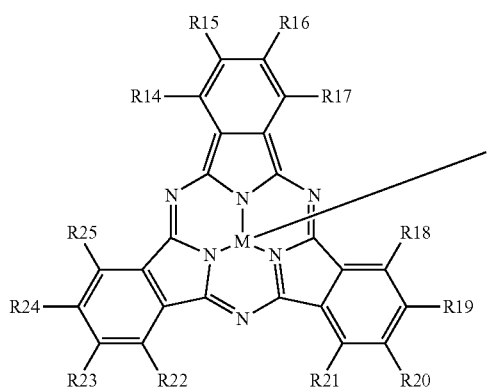 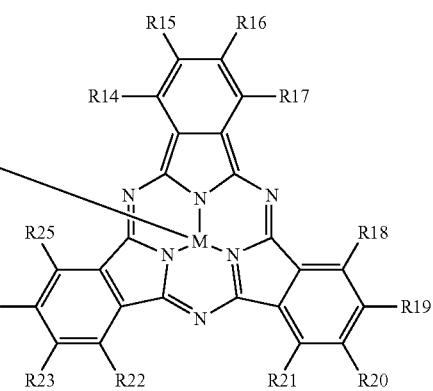

where R14 to R25 and X denote, each independently: hydrogen atom; halogen atom; a linear chain, branched, or cyclic alkyl group; thioalkyl group; thioaryl group; arylsulfonyl group; alkylsulfonyl group; amino group; alkylamino group; arylamino group; hydroxy group; alkoxy group; acylamino group; acyloxy group; phenyl group; carboxy group; carboxoamide group; carboalkoxy group; acyl group; sulfonyl group; cyano group; nitro group; heterocyclic group; or a derivative, wherein mutually adjacent R14 to R25 form a cycle by bonding with each other, and M denotes boron, or a divalent or trivalent metal.

8. The photoelectric conversion element according to claim 1, wherein the photoelectric conversion layer includes a p-type semiconductor.

9. The photoelectric conversion element according to claim 8, wherein the p-type semiconductor comprises a quinacridone derivative.

10. The photoelectric conversion element according to claim 8, wherein the photoelectric conversion layer further includes an n-type semiconductor.

11. The photoelectric conversion element according to claim 10, wherein the n-type semiconductor comprises a fullerene derivative.

12. An imaging device, comprising:
a plurality of pixels, wherein
each of the plurality of pixels comprises at least one organic photoelectric conversion section, and
each of the at least one organic photoelectric conversion section comprises:
a first electrode;
a second electrode that faces the first electrode, wherein the first electrode and the second electrode are electrically coupled to at least one electrically-conductive plug; and
a photoelectric conversion layer between the first electrode and the second electrode, wherein
the photoelectric conversion layer comprises at least a subphthalocyanine or a subphthalocyanine derivative, and a carrier dopant, and
the carrier dopant has a concentration of less than 1% by volume ratio to the subphthalocyanine or the subphthalocyanine derivative.

13. The imaging device according to claim 12, wherein
the at least one organic photoelectric conversion section and at least one inorganic photoelectric conversion section are stacked in each of the plurality of pixels,
the at least one inorganic photoelectric conversion section performs photoelectric conversion of a wavelength region different from that of the at least one organic photoelectric conversion section.

14. The imaging device according to claim 13, wherein
the at least one inorganic photoelectric conversion section is embedded in a semiconductor substrate, and
the organic photoelectric conversion section is on a first face side of the semiconductor substrate.

15. The imaging device according to claim 14, wherein
the at least one organic photoelectric conversion section performs the photoelectric conversion of green light, and
a first inorganic photoelectric conversion section of the at least one inorganic photoelectric conversion section that performs the photoelectric conversion of blue light and a second inorganic photoelectric conversion section of the at least one inorganic photoelectric conversion section that performs the photoelectric conversion of red light are stacked in the semiconductor substrate.

16. An electronic apparatus, comprising:
an imaging device that comprises a plurality of pixels, wherein
each of the plurality of pixels comprises at least one organic photoelectric conversion section, and
each of the at least one organic photoelectric conversion section comprises:
a first electrode;
a second electrode that faces the first electrode, wherein the first electrode and the second electrode are electrically coupled to at least one electrically-conductive plug; and
a photoelectric conversion layer between the first electrode and the second electrode, wherein
the photoelectric conversion layer comprises at least a subphthalocyanine or a subphthalocyanine derivative, or a carrier dopant, and
the carrier dopant has a concentration of less than 1% by volume ratio to the subphthalocyanine or the subphthalocyanine derivative.

* * * * *